(12) United States Patent
Radosavljevic et al.

(10) Patent No.: US 7,879,675 B2
(45) Date of Patent: Feb. 1, 2011

(54) FIELD EFFECT TRANSISTOR WITH METAL SOURCE/DRAIN REGIONS

(75) Inventors: Marko Radosavljevic, Beaverton, OR (US); Suman Datta, Beaverton, OR (US); Brian S. Doyle, Portland, OR (US); Jack Kavalieros, Portland, OR (US); Justin K. Brask, Portland, OR (US); Mark L. Doczy, Beaverton, OR (US); Amian Majumdar, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 271 days.

(21) Appl. No.: 12/114,227

(22) Filed: May 2, 2008

(65) Prior Publication Data

US 2009/0325350 A1    Dec. 31, 2009

Related U.S. Application Data

(62) Division of application No. 11/080,765, filed on Mar. 14, 2005, now abandoned.

(51) Int. Cl.
*H01L 21/336* (2006.01)

(52) U.S. Cl. ............... 438/268; 438/300; 257/E21.425; 257/E21.431

(58) Field of Classification Search .......... 257/E21.425, 257/902, E21.431; 438/268, 300
See application file for complete search history.

(56) References Cited

U.S. PATENT DOCUMENTS

| | | | |
|---|---|---|---|
| 4,231,149 A | 11/1980 | Chapman et al. | |
| 4,487,652 A | 12/1984 | Almgren | |
| 4,711,701 A | 12/1987 | McLevige | |
| 4,818,715 A | 4/1989 | Chao | |
| 4,905,063 A | 2/1990 | Beltram et al. | |
| 4,906,589 A | 3/1990 | Chao | |
| 4,907,048 A | 3/1990 | Huang | |
| 4,994,873 A | 2/1991 | Madan | |
| 4,996,574 A | 2/1991 | Shirasaki et al. | |
| 5,023,203 A | 6/1991 | Choi | |
| 5,120,666 A | 6/1992 | Gotou | |

(Continued)

FOREIGN PATENT DOCUMENTS

DE    10203998    8/2003

(Continued)

OTHER PUBLICATIONS

Office Action from PRC Application No. 200580007279.5, PCT/US05/000947, mailed Apr. 4, 2008, 2 pgs.

(Continued)

*Primary Examiner*—W. David Coleman
*Assistant Examiner*—Sun M Kim
(74) *Attorney, Agent, or Firm*—Blakely, Sokoloff, Taylor & Zafman LLP

(57) ABSTRACT

A semiconductor device comprising a gate electrode formed on a gate dielectric layer formed on a semiconductor film. A pair of source/drain regions are formed adjacent the channel region on opposite sides of the gate electrode. The source and drain regions each comprise a semiconductor portion adjacent to and in contact with the semiconductor channel and a metal portion adjacent to and in contact with the semiconductor portion.

8 Claims, 10 Drawing Sheets

U.S. PATENT DOCUMENTS

| | | | |
|---|---|---|---|
| 5,124,777 A | 6/1992 | Lee | |
| 5,179,037 A | 1/1993 | Seabaugh | |
| 5,216,271 A | 6/1993 | Takagi et al. | |
| 5,278,102 A | 1/1994 | Horie | |
| 5,308,999 A | 5/1994 | Gotou | |
| 5,328,810 A | 7/1994 | Lowrey et al. | |
| 5,338,959 A | 8/1994 | Kim et al. | |
| 5,346,836 A | 9/1994 | Manning et al. | |
| 5,346,839 A | 9/1994 | Sundaresan | |
| 5,357,119 A | 10/1994 | Wang et al. | |
| 5,391,506 A | 2/1995 | Tada et al. | |
| 5,466,621 A | 11/1995 | Hisamoto et al. | |
| 5,475,869 A | 12/1995 | Gomi et al. | |
| 5,479,033 A | 12/1995 | Baca et al. | |
| 5,482,877 A | 1/1996 | Rhee | |
| 5,514,885 A | 5/1996 | Myrick | |
| 5,521,859 A | 5/1996 | Ema et al. | |
| 5,543,351 A | 8/1996 | Hirai et al. | |
| 5,545,586 A | 8/1996 | Koh | |
| 5,563,077 A | 10/1996 | Ha | |
| 5,576,227 A | 11/1996 | Hsu | |
| 5,578,513 A | 11/1996 | Maegawa | |
| 5,595,919 A | 1/1997 | Pan | |
| 5,652,454 A | 7/1997 | Iwamatsu et al. | |
| 5,658,806 A | 8/1997 | Lin et al. | |
| 5,665,203 A | 9/1997 | Lee et al. | |
| 5,682,048 A | 10/1997 | Shinohara et al. | |
| 5,698,869 A | 12/1997 | Yoshimi et al. | |
| 5,701,016 A | 12/1997 | Burroughes et al. | |
| 5,716,879 A | 2/1998 | Choi et al. | |
| 5,739,544 A | 4/1998 | Yuki et al. | |
| 5,760,442 A | 6/1998 | Shigyo et al. | |
| 5,770,513 A | 6/1998 | Okaniwa et al. | |
| 5,773,331 A | 6/1998 | Solomon et al. | |
| 5,776,821 A | 7/1998 | Haskell et al. | |
| 5,793,088 A | 8/1998 | Choi et al. | |
| 5,804,848 A | 9/1998 | Mukai | |
| 5,811,324 A | 9/1998 | Yang | |
| 5,814,895 A | 9/1998 | Hirayama et al. | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,856,225 A | 1/1999 | Lee et al. | |
| 5,880,015 A | 3/1999 | Hata | |
| 5,888,309 A | 3/1999 | Yu | |
| 5,889,304 A | 3/1999 | Watanabe et al. | |
| 5,899,710 A | 5/1999 | Mukai | |
| 5,905,285 A | 5/1999 | Gardner et al. | |
| 5,908,313 A | 6/1999 | Chau et al. | |
| 5,952,701 A | 9/1999 | Bulucea et al. | |
| 5,965,914 A | 10/1999 | Miyamoto | |
| 5,976,767 A | 11/1999 | Li | |
| 5,985,726 A | 11/1999 | Yu et al. | |
| 6,013,926 A | 1/2000 | Oku et al. | |
| 6,018,176 A | 1/2000 | Lim | |
| 6,031,249 A | 2/2000 | Yamazaki et al. | |
| 6,051,452 A | 4/2000 | Shigyo et al. | |
| 6,054,355 A | 4/2000 | Inumiya et al. | |
| 6,063,675 A | 5/2000 | Rodder | |
| 6,063,677 A | 5/2000 | Rodder et al. | |
| 6,066,869 A | 5/2000 | Noble et al. | |
| 6,087,208 A | 7/2000 | Krivokapic et al. | |
| 6,093,621 A | 7/2000 | Tseng | |
| 6,114,201 A | 9/2000 | Wu | |
| 6,114,206 A | 9/2000 | Yu | |
| 6,117,741 A | 9/2000 | Chatterjee et al. | |
| 6,120,846 A | 9/2000 | Hintermaier et al. | |
| 6,144,072 A | 11/2000 | Iwamatsu et al. | |
| 6,150,222 A | 11/2000 | Gardner et al. | |
| 6,153,485 A | 11/2000 | Pey et al. | |
| 6,163,053 A | 12/2000 | Kawashima | |
| 6,165,880 A | 12/2000 | Yaung et al. | |
| 6,174,820 B1 | 1/2001 | Habermehl et al. | |
| 6,190,975 B1 | 2/2001 | Kubo et al. | |
| 6,200,865 B1 | 3/2001 | Gardner et al. | |
| 6,218,309 B1 | 4/2001 | Miller et al. | |
| 6,251,729 B1 | 6/2001 | Montree et al. | |
| 6,251,763 B1 | 6/2001 | Inumiya et al. | |
| 6,252,284 B1 | 6/2001 | Muller et al. | |
| 6,259,135 B1 | 7/2001 | Hsu et al. | |
| 6,261,921 B1 | 7/2001 | Yen et al. | |
| 6,262,456 B1 | 7/2001 | Yu et al. | |
| 6,274,503 B1 | 8/2001 | Hsieh | |
| 6,287,924 B1 | 9/2001 | Chao et al. | |
| 6,294,416 B1 | 9/2001 | Wu | |
| 6,307,235 B1 | 10/2001 | Forbes et al. | |
| 6,310,367 B1 | 10/2001 | Yagishita et al. | |
| 6,319,807 B1 | 11/2001 | Yeh et al. | |
| 6,335,251 B2 | 1/2002 | Miyano et al. | |
| 6,358,800 B1 | 3/2002 | Tseng | |
| 6,359,311 B1 | 3/2002 | Colinge et al. | |
| 6,362,111 B1 | 3/2002 | Laaksonen et al. | |
| 6,368,923 B1 | 4/2002 | Huang | |
| 6,376,317 B1 | 4/2002 | Forbes et al. | |
| 6,383,882 B1 | 5/2002 | Lee et al. | |
| 6,387,820 B1 | 5/2002 | Sanderfer | |
| 6,391,782 B1 | 5/2002 | Yu | |
| 6,396,108 B1 | 5/2002 | Krivokapic et al. | |
| 6,399,970 B2 | 6/2002 | Kubo et al. | |
| 6,403,434 B1 | 6/2002 | Yu | |
| 6,403,981 B1 | 6/2002 | Yu | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,424,015 B1 | 7/2002 | Ishibashi et al. | |
| 6,437,550 B2 | 8/2002 | Andoh et al. | |
| 6,458,662 B1 | 10/2002 | Yu | |
| 6,459,123 B1 | 10/2002 | Enders et al. | |
| 6,465,290 B1 | 10/2002 | Suguro et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,479,866 B1 | 11/2002 | Xiang | |
| 6,483,146 B2 | 11/2002 | Lee et al. | |
| 6,483,151 B2 | 11/2002 | Wakabayashi et al. | |
| 6,483,156 B1 | 11/2002 | Adkisson et al. | |
| 6,495,403 B1 | 12/2002 | Skotnicki et al. | |
| 6,498,096 B2 | 12/2002 | Bruce et al. | |
| 6,500,767 B2 | 12/2002 | Chiou et al. | |
| 6,501,141 B1 | 12/2002 | Leu | |
| 6,506,692 B2 | 1/2003 | Andideh | |
| 6,525,403 B2 | 2/2003 | Inaba et al. | |
| 6,526,996 B1 | 3/2003 | Chang et al. | |
| 6,534,807 B2 | 3/2003 | Mandelman et al. | |
| 6,537,862 B2 | 3/2003 | Song | |
| 6,537,885 B1 | 3/2003 | Kang et al. | |
| 6,537,901 B2 | 3/2003 | Cha et al. | |
| 6,541,829 B2 | 4/2003 | Nishinohara et al. | |
| 6,555,879 B1 | 4/2003 | Krivokapic et al. | |
| 6,562,665 B1 | 5/2003 | Yu | |
| 6,562,687 B1 | 5/2003 | Deleonibus | |
| 6,566,734 B2 | 5/2003 | Sugihara et al. | |
| 6,583,469 B1 | 6/2003 | Fried et al. | |
| 6,605,498 B1 | 8/2003 | Murthy et al. | |
| 6,610,576 B2 | 8/2003 | Nowak | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |
| 6,642,090 B1 | 11/2003 | Fried et al. | |
| 6,642,114 B2 | 11/2003 | Nakamura | |
| 6,645,797 B1 | 11/2003 | Buynoski et al. | |
| 6,645,826 B2 | 11/2003 | Yamazaki et al. | |
| 6,645,861 B2 | 11/2003 | Cabral et al. | |
| 6,656,853 B2 | 12/2003 | Ito | |

| | | |
|---|---|---|
| 6,657,259 B2 | 12/2003 | Fried et al. |
| 6,660,598 B2 | 12/2003 | Hanafi et al. |
| 6,664,160 B2 | 12/2003 | Park et al. |
| 6,680,240 B1 | 1/2004 | Maszara |
| 6,686,231 B1 | 2/2004 | Ahmed et al. |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,705,571 B2 | 3/2004 | Yu et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,770,516 B2 | 8/2004 | Wu et al. |
| 6,774,390 B2 | 8/2004 | Sugiyama et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,864,540 B1 | 3/2005 | Divakaruni et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,869,898 B2 | 3/2005 | Inaki et al. |
| 6,870,226 B2 | 3/2005 | Maeda et al. |
| 6,884,154 B2 | 4/2005 | Mizushima et al. |
| 6,885,055 B2 | 4/2005 | Lee |
| 6,891,234 B1 | 5/2005 | Connelly et al. |
| 6,897,527 B2 | 5/2005 | Dakshina-Murthy et al. |
| 6,902,962 B2 | 6/2005 | Yeo et al. |
| 6,909,151 B2 | 6/2005 | Hareland |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,960,517 B2 | 11/2005 | Rios et al. |
| 6,967,351 B2 | 11/2005 | Fried et al. |
| 6,974,738 B2 | 12/2005 | Hareland |
| 6,975,014 B1 | 12/2005 | Krivokapic et al. |
| 6,977,415 B2 | 12/2005 | Matsuo |
| 6,998,301 B1 | 2/2006 | Yu et al. |
| 6,998,318 B2 | 2/2006 | Park |
| 7,018,551 B2 | 3/2006 | Beintner et al. |
| 7,045,401 B2 | 5/2006 | Lee et al. |
| 7,045,407 B2 | 5/2006 | Keating et al. |
| 7,045,441 B2 | 5/2006 | Chang et al. |
| 7,056,794 B2 | 6/2006 | Ku et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,084,018 B1 | 8/2006 | Ahmed et al. |
| 7,105,390 B2 | 9/2006 | Brask et al. |
| 7,105,891 B2 | 9/2006 | Visokay |
| 7,105,894 B2 | 9/2006 | Yeo et al. |
| 7,105,934 B2 | 9/2006 | Anderson et al. |
| 7,112,478 B2 | 9/2006 | Grupp et al. |
| 7,115,945 B2 | 10/2006 | Lee et al. |
| 7,119,402 B2 | 10/2006 | Kinoshita et al. |
| 7,122,463 B2 | 10/2006 | Ohuchi |
| 7,141,856 B2 | 11/2006 | Lee et al. |
| 7,154,118 B2 | 12/2006 | Lindert |
| 7,163,851 B2 | 1/2007 | Abadeer et al. |
| 7,183,137 B2 | 2/2007 | Lee et al. |
| 7,187,043 B2 | 3/2007 | Arai et al. |
| 7,238,564 B2 | 7/2007 | Ko et al. |
| 7,241,653 B2 | 7/2007 | Hareland et al. |
| 7,247,547 B2 | 7/2007 | Zhu et al. |
| 7,250,645 B1 | 7/2007 | Wang et al. |
| 7,291,886 B2 | 11/2007 | Doris et al. |
| 7,348,284 B2 | 3/2008 | Doyle et al. |
| 7,354,817 B2 | 4/2008 | Watanabe et al. |
| 7,358,121 B2 | 4/2008 | Chau et al. |
| 7,396,730 B2 | 7/2008 | Li |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim et al. |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino et al. |
| 2003/0067017 A1 | 4/2003 | Ieong et al. |
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0190766 A1 | 10/2003 | Gonzalez et al. |
| 2003/0201458 A1 | 10/2003 | Clark et al. |
| 2003/0227036 A1 | 12/2003 | Sugiyama et al. |
| 2004/0016968 A1 | 1/2004 | Coronel et al. |

| | | |
|---|---|---|
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |
| 2004/0108558 A1 | 6/2004 | Kwak et al. |
| 2004/0110097 A1 | 6/2004 | Ahmed et al. |
| 2004/0119100 A1 | 6/2004 | Nowak et al. |
| 2004/0124492 A1 | 7/2004 | Matsuo |
| 2004/0126975 A1 | 7/2004 | Ahmed et al. |
| 2004/0132236 A1 | 7/2004 | Doris et al. |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0169221 A1 | 9/2004 | Ko et al. |
| 2004/0169269 A1 | 9/2004 | Yeo et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0019993 A1 | 1/2005 | Lee et al. |
| 2005/0020020 A1 | 1/2005 | Collaert et al. |
| 2005/0035415 A1 | 2/2005 | Yeo et al. |
| 2005/0040444 A1 | 2/2005 | Cohen |
| 2005/0059214 A1 | 3/2005 | Cheng et al. |
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0110082 A1 | 5/2005 | Cheng |
| 2005/0116289 A1 | 6/2005 | Boyd et al. |
| 2005/0118790 A1 | 6/2005 | Lee et al. |
| 2005/0127362 A1 | 6/2005 | Zhang et al. |
| 2005/0127632 A1 | 6/2005 | Gehret |
| 2005/0133866 A1 | 6/2005 | Chau et al. |
| 2005/0136584 A1 | 6/2005 | Boyanov et al. |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161739 A1 | 7/2005 | Anderson et al. |
| 2005/0167766 A1 | 8/2005 | Yagishita |
| 2005/0170593 A1 | 8/2005 | Kang et al. |
| 2005/0184316 A1 | 8/2005 | Kim |
| 2005/0189583 A1 | 9/2005 | Kim et al. |
| 2005/0199919 A1 | 9/2005 | Liu |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224800 A1 | 10/2005 | Lindert et al. |
| 2005/0227498 A1 | 10/2005 | Furukawa |
| 2005/0230763 A1 | 10/2005 | Huang et al. |
| 2005/0233156 A1 | 10/2005 | Senzaki |
| 2005/0239252 A1 | 10/2005 | Ahn et al. |
| 2005/0255642 A1 | 11/2005 | Liu et al. |
| 2005/0266645 A1 | 12/2005 | Park |
| 2005/0272192 A1 | 12/2005 | Oh et al. |
| 2005/0277294 A1 | 12/2005 | Schaeffer et al. |
| 2005/0280121 A1 | 12/2005 | Doris et al. |
| 2006/0014338 A1 | 1/2006 | Doris et al. |
| 2006/0040054 A1 | 2/2006 | Pearlstein et al. |
| 2006/0046521 A1 | 3/2006 | Vaartstra et al. |
| 2006/0063469 A1 | 3/2006 | Talieh et al. |
| 2006/0068591 A1 | 3/2006 | Radosavljevic et al. |
| 2006/0071299 A1 | 4/2006 | Doyle et al. |
| 2006/0086977 A1 | 4/2006 | Shah et al. |
| 2006/0154478 A1 | 7/2006 | Hsu et al. |
| 2006/0172480 A1 | 8/2006 | Wang et al. |
| 2006/0202270 A1 | 9/2006 | Son et al. |
| 2006/0205164 A1 | 9/2006 | Ko et al. |
| 2006/0211184 A1 | 9/2006 | Boyd et al. |
| 2006/0227595 A1 | 10/2006 | Chuang et al. |
| 2006/0240622 A1 | 10/2006 | Lee et al. |
| 2006/0263699 A1 | 11/2006 | Abatchev et al. |
| 2006/0281325 A1 | 12/2006 | Chou et al. |
| 2007/0001219 A1 | 1/2007 | Radosavljevic et al. |
| 2007/0007530 A1 * | 1/2007 | Wong et al. ............ 257/66 |
| 2007/0023795 A1 | 2/2007 | Nagano et al. |
| 2007/0045748 A1 | 3/2007 | Booth, Jr. et al. |
| 2007/0048930 A1 | 3/2007 | Figura et al. |
| 2007/0093010 A1 | 4/2007 | Mathew et al. |
| 2007/0108514 A1 | 5/2007 | Inoue et al. |
| 2007/0241414 A1 | 10/2007 | Narihiro |
| 2007/0262389 A1 | 11/2007 | Chau et al. |

FOREIGN PATENT DOCUMENTS

| | | |
|---|---|---|
| EP | 0510667 | 10/1992 |
| EP | 0623963 | 5/1994 |
| EP | 1091413 | 4/2001 |
| EP | 1202335 | 5/2002 |
| EP | 1566844 | 8/2005 |
| GB | 2156149 | 10/1985 |
| JP | 56073454 | 6/1981 |
| JP | 59145538 | 8/1984 |
| JP | 2303048 | 12/1990 |
| JP | 06005856 | 1/1994 |
| JP | 6151387 | 5/1994 |
| JP | 406177089 A | 6/1994 |
| JP | 06224440 | 8/1994 |
| JP | 9162301 | 6/1997 |
| JP | 20037842 | 2/2000 |
| JP | 2000037842 | 2/2000 |
| JP | 2001-189453 | 7/2001 |
| JP | 2001338987 | 12/2001 |
| JP | 2002298051 | 10/2002 |
| JP | 2003298051 | 10/2003 |
| TW | 200414538 | 8/1992 |
| TW | 200518310 | 11/1992 |
| TW | 516232 | 1/2003 |
| TW | 561530 | 1/2003 |

| | | |
|---|---|---|
| TW | 548799 | 8/2003 |
| TW | 200402872 | 2/2004 |
| TW | 200405408 | 4/2004 |
| TW | 200417034 | 9/2004 |
| WO | WO0243151 | 5/2002 |
| WO | WO02095814 | 11/2002 |
| WO | WO03003442 | 1/2003 |
| WO | WO2004059726 | 7/2004 |
| WO | WO2005036651 | 4/2005 |

OTHER PUBLICATIONS

Written Opinion from Singapore Patent Application No. 200604766-6 mailed Apr. 4, 2008, 4 pgs.
Office Action from Taiwan Patent Application No. 95122087 mailed Jun. 10, 2008, 8 pgs.
IPO Search Report for Application No. 094136197, date mailed Sep. 19, 2008, 1 pg.
Office Action from European Patent Application No. 03817699.6 mailed Aug. 29, 2007, 3 pgs.
Written Opinion from Patent Application No. 2005070131 mailed Mar. 18, 2007, 4 pgs.
International Preliminary Report on Patentability from Application No. PCT/US2006/024516 mailed Jan. 10, 2008, 11 pgs.
Office Action from Taiwan Patent Application No. 95123858 dated Oct. 9, 2008, 10pgs.
Office Action from U.S. Appl. No. 12/025,665 mailed on Nov. 12, 2008, 8 pgs.
International Search Report PCT/US2003/40320 mailed Jun. 2, 2004, 6 pgs.
Office Action from U.S. Appl. No. 11/855,823 mailed Dec. 30, 2008, 18 pgs.
Office Action from Taiwan Patent Application No. 95135820 mailed on Jan. 9, 2009, 14 pgs.
Collaert, N., et al., "A Functional 41-stage ring oscillator using scaled FinFET devices with 25-nm gate lengths and 10-nm fin widths applicable for the 45-nm CMOS node", IEEE Electron Device Letters, vol. 25, No. 8, Aug. 2004, 3 pgs.
Tang, Stephen H., et al., "FinFET—A Quasi-Planar Double-Gate MOSFET", 2001 IEEE International Solid-State Circuits Conference, Feb. 6, 2001, 3 pgs.
Office Action from U.S. Appl. No. 11/080,765 mailed May 2, 2007, 21 pgs.
Final Office Action from U.S. Appl. No. 11/080,765 mailed Nov. 13, 2007, 13 pgs.
"U.S. Appl. No. 10/227,068 Office Action", (Dec. 18, 2006), pp. 1-25.
"U.S. Appl. No. 10/703,316 Office Action", (Dec. 15, 2006), pp. 1-22.
"U.S. Appl. No. 11/158,661 Final Office Action", (Jan. 15, 2008), 25 pages.
"International Application No.", PCT/2004/032442, (Jun. 16, 2005), 1-10.
"International Preliminary Report on Patentability", PCT/US2005/010505, (Oct. 12, 2006), 1-16.
"International Search Report", PCT/US2003/26242, (Jan. 26, 2004), 1-8.
"International Search Report", PCT/US2003/39727, P15677PCT, (Apr. 27, 2004), 1-6.
"International Search Report", PCT/US2003/40320, (Jun. 2, 2004), 1-6.
"International Search Report", PCT/US2005/010505, (Aug. 26, 2005), 1-24.
"International Search Report & Written Opinion", PCT/US2006/000378, (May 24, 2006), 1-11.
"International Search Report & Written Opinion", PCT/US2004/032442, (Jun. 16, 2005), 1-21.
"International Search Report & Written Opinion", PCT/US2006/024516, (Jan. 17, 2007), 1-18.
"International Search & Written Opinion", PCT/US2006/037634 (May 31, 2007) 1-21.
"International Search Report & Written Opinion", PCT/US2005/000947, (May 3, 2005), 1-14.
"International Search Report & Written Opinion", PCT/US2006/025751, (Dec. 6, 2006), 1-14.
"International Search Report & Written Opinion", PCT/US2005/035380, (Feb. 13, 2006), 1-14.
"International Search Report & Written Opinion", PCT/US2005/033439, (Jan. 31, 2006), 1-7.
"International Search Report & Written Opinion", PCT/US2005/037169, (Feb. 23, 2006), 1-11.
"International Search Report & Written Opinion", PCT/US2006/037643, (Jan. 24, 2007), 1-14.
"International Search Report and Written Opinion", PCT/US2005/020339, (Oct. 4, 2005), 1-12.
Auth, Christopher P., et al., "Vertical, Fully-Depleted, Surroundings Gate MOSFETS On sub-0.1 um Thick Silicon Pillars", *54th Annual Device Research Conference Digest*, (1996), pp. 108-109.
Buchanan, D. A., et al., "Fabrication of Midgap Metal Gates Compatible With Ultrathin Dielectrics", *Applied Physics Letters 73.12*, (Sep. 21, 1998), pp. 1676-1678.
Burenkov, A. et al., "Corner effect in Double and Triple Gate FinFETs", *European Solid-State Device Research 2003, 33rd Conference on. ESSDERC*, (Sep. 16, 2003), pp. 135-138.
Chang, S. T., et al., "3-D Simulation of Strained S/SiGe heterojunction FinFets", *Semiconductor Device Research Symposium*, 2003 International Dec. 10-12, 2003, Piscataway, NJ, USA (Dec. 2003), p. 176-177.
Chang, L., et al., "CMOS Circuit Performance Enhancement by Surface Orientation Optimization", *IEEE Transactions on Electron Devices*, vol. 51, No. 10, (Oct. 2004), pp. 1621-1627.
Chau, Robert, "Advanced Metal Gate/High-K Dielectric Stacks for High-Performance CMOS Transistors", Components Research, Intel Corporation, (2004), 1-3.
Choi, Yang-Kyu, et al., "A Spacer Patterning Technology for Nanoscale CMOS", IEEE, (49)3, XP-001102694, (2002), 436-441.
Choi, Yang-Kyu, et al., "Sub-20nm CMOS FinFET Technologies", IEEE, IEDM 01-421 to 1-424, (2001), 1-4.
Claflin, B., et al., "Interface Studies of Tungsten Nitride And Titanium Nitride Composite Metal Gate Electrodes With Thin Dielectric Layers", *Journal of Vacuum Science and Technology A 16.3*, (May/Jun. 1998), pp. 1757-1761.
Fried, David M., et al., "High-Performance P-Type Independent-Gate FinFETs", IEEE 25(4):, (2004), 199-201.
Fried, David M., et al., "Improved Independent Gate N-Type FinFET Fabrication and Characterization", IEEE 24(9):, 1-3.
Guo, Jing, et al., "Performance Projections for Ballistic Carbon Nanotube Field-Effect Transistors", Applied Physics Letters 80(17):, (Apr. 29, 2002), 3192-3194.
Hisamoto, Digh, et al., "A Folded-channel MOSFET for Deep-sub-tenth Micron Era", IEEE, (1998), 15.7.1-15.7.3.
Hisamoto, Digh, "A Fully Depleted Lean-Channel Transistor (DELTA)—A Novel Vertical Ultrahin SOI MOSFET", *IEEE Electron Device Letters*, V. 11 (1), (1990), pp. 36-38.
Hisamoto, Digh, "FinFET—A Self-Aligned Double-Gate MOSFET Scalable to 20 nm", *IEEE Transactions on Electron Devices*, vol. 47, No. 12, (Dec. 2000), pp. 2320-2325.
Huang, Xuejue, et al., "Sub 50-nm FinFET: PMOS", *1999 IEEE International Electron Device Meeting Technical Digest*, IEEE, (1999), pp. 3.4.1-3.4.4.
Hwang, Jeong-Mo, et al., "Novel Polysilicon/Tin Stacked-Gate Structure for Fully-Depleted SOI/CMOS", *International Electronic Devices Meeting Technical Digest*,(1992), pp. 345-348.
Ieong, et al., "Three Dimensional CMOS Devices and Integrated Circuits", IEEE CICC, San Jose, CA Sep. 21-24, 2003, 207-217.
Javey, Ali, et al., "Ballistic Carbon Nanotube Field-Effect Transistors", *Nature*, vol. 424, (Aug. 3, 2003), 654-657.
Javey, Ali, et al., "High-k Dielectrics for Advanced Carbon-Nanotube Transistors and Logic Gates", www.nature.com/naturematerials.com, (2002), 1-8.
Jin, B., "Mobility Enhancement in Compressively Strained Sige Surface Channel PMOS Transistors with HFO2/TIN Gate Stack", Components Research, Intel Corporation, 1-12.
Jones, E. C., et al., "Doping Challenges in Exploratory Devices for High Performance Logic", 14th Int'l Conference, Piscataway, NJ, Sep. 22-27, 2002, 1-6.

Kim, Sung M., et al., "A Novel Multi-channel Field Effect Transistor (McFET) on Bulk Si for High Performance Sub-80nm Application", IEEE, (2004), 1-4.

Kuo, Charles, et al., "A Capacitorless Double Gate DRAM Technology for Sub-100-nm Embedded and Stand-Alone Memory Applications", IEEE 50(12):, (2003), 2408-2416.

Kuo, Charles, et al., "A Capacitorless Double-Gate DRAM Cell Design for High Density Applications", IEEE, (2002), 843-846.

Ludwig, et al., "FinFET Technology for Future Microprocessors", 2003 IEEE Int'l. SOI Conference, New Port Beach, CA, Sep. 29-Oct. 2, 2003, 33-34.

Martel, Richard, et al., "Carbon Nanotube Field Effect Transistors for Logic Applications", IEEE, 7.5.1-7.5.4.

Mayer, T. M., et al., "Chemical Vapor Deposition of Flouroalkylsilane Monolayer Films for Adhesion Control in Microelectromechanical Systems", J. Vac. Sci. Technol. B. 18(5):, (2000), 2433-2440.

Nackaerts, et al., "A 0.314um2 6T-SRAM Cell build with Tall Triple-Gate Devices for 45nm node applications using 0.75NA 193nm lithography", IDEM, (2004), 269-272.

Nowak, E. J., et al., "A Functional FinFET-DGCMOS SRAM Cell", Int'l. Electron Devices Meeting, San Francisco, CA Dec. 8-11, 2002, 411-414.

Nowak, E. J., et al., "Scaling Beyond the 65 nm Node with FinFET-DGCMOS", IEEE CICC, San Jose, CA Sep. 21-24, 2003, 339-342.

Nowak, Edward J., et al., "Turning Silicon on Its Edge.", *IEEE Circuits & Devices Magazine vol. 1*, (Jan./Feb. 2004).

Ohsawa, Takashi, et al., "Memory Design Using a One-Transistor Gain Cell on SOI", *IEEE 37*(11):, (2002), 1510-1522.

Park, Donggun, et al., "3-dimensional nano-CMOS Transistors to Overcome Scaling Limits", *IEEE 2004*, ISBN 0-7803-8511-X, (2004), 35-40.

Park, T., et al., "Fabrication of Body-Tied FinFETs (Omega MOSFETS) Using Bulk Si Wafers", *2003 Symposia on VLSI Technology Digest of Technical Papers*, (Jun. 2003), pp. 135-136.

Park, T., et al., "Fabrication of Body-Tied FinFETs (Omega MOSFETs) Using Bulk Si Wafers", 2003 Symposium on VLSI Technology Digest of Technical Papers, (2003), 1-2.

Park, Jong-Tae, et al., "Pi-Gate SOI MOSFET", *IEEE Electron Device Letters*, vol. 22, No. 8, (Aug. 2001), pp. 405-406.

Park, et al., "PMOS Body-Tied FinFET (Omega MOSFET) Characteristics", Device Research Conference, Piscataway, NJ, Jun. 23-25, IEEE, (Jun. 2003), pp. 33-34.

Park, Jae-Hyoun, et al., "Quantum-Wired MOSFET Photodetector Fabricated by Conventional Photolighography on SOI Substrate", *Nanotechnology*, 4th IEEE Conference on Munich, Germany, Aug. 16-19, 2004, Piscataway, NJ, XP010767302, (2004), pp. 425-427.

Seevinck, Evert, et al., "Static-Noise Margin Analysis of MOS SRAM Cells", IEEE, Journal of Solid-State Circuits, (SC-22)5, (1987), 1-7.

Stadele, M., et al., "A Comprehensive Study of Corner Effects in Tri-gate Transistors", *IEEE 2004*, pp. 165-168.

Stolk, Peter A., et al., "Modeling Statistical Dopant Fluctuations in MOS Transistors", IEEE Transactions on Electron Devices, (45)9, (1998), 1960-1971.

Subramanian, V., "A Bulk-Si-Compatible Ultrathin-body SOI Technology for Sub-100m MOSFETS", *Proceeding of the 57th Annual Device Research Conference*, (1999), pp. 28-29.

Sugizaki, T., et al., "Novel Multi-bit SONOS Type Flash Memory Using a High-k Charge Trapping Layer", *VLSI Technology, 2003. Digest of Technical Papers*. Symposium on Jun. 10-12, 2003., (2003), pp. 27-28.

Tanaka, T., et al., "Scalability Study on a Capacitorless IT-DRAM: From Single-gate PD-SOI to Double-gate FinDRAM", IEEE, (2004), 1-4.

Tokoro, Kenji, et al., "Anisotropic Etching Properties of Silicon in KOH and TMAH Solutions", International Symposium on Micromechatronics and Human Science, *IEEE*, (1998), pp. 65-70.

Wolf, Stanley, et al., "Wet Etching Silicon", *Silicon Processing for the VLSI Era, vol. 1: Process Technology*, Lattice Press, Sunset Beach, CA, (Sep. 1986), 3 pages.

Xiong, W., et al., "Corner Effect in Multiple-Gate SOI MOSFETs", IEEE, (2003), 111-113.

Xiong, Weize, et al., "Improvement of FinFET Electrical Characteristics by Hydrogen Annealing", 25(8):, (2004), 541-543.

Yang, Fu-Liang, et al., "5nm-Gate Nanowire FinFET", IEEE, (2004), 196-197.

Office Action from Taiwan Patent Application No. 95123858—translation, mailed Mar. 3, 2009, 10 pgs.

Office Action from U.S. Appl. No. 11/240,487 mailed Mar. 17, 2009, 13 pgs.

Office Action from U.S. Appl. No. 11/322,795 mailed Mar. 4, 2009, 12 pgs.

Office Action from Taiwan Patent Application No. 95122087 mailed Dec. 16, 2008, 14 pgs.

Office Action for German Patent Application No. 11 2006 003 576.2-33 mailed Dec. 12, 2008, 3 pgs.

Office Action from U.S. Appl. No. 11/154,138 mailed Jun. 23, 2009, 14 pgs.

Office Action from Taiwan Patent Application No. 95135820 mailed Jun. 4, 2009, 9 pgs.

Second Office Action from Chinese Patent Application No. 200580032314.9 mailed May 8, 2009, 14 pgs.

Final Office Action from U.S. Appl. No. 12/025,665 mailed Jun. 10, 2009, 14 pgs.

Office Action from Chinese Patent Application No. 200680023301.X mailed Jun. 26, 2009, 11 pgs.

Final Office Action from U.S. Appl. No. 11/240,487 mailed Sep. 21, 2009, 22 pgs.

Non-Final Office Action for U.S. Appl. No. 12/259,464, mailed Oct. 20, 2009, 41 pgs.

Notice of Preliminary Rejection for Korean Application No. 10-2007-7030988 mailed Sep. 14, 2009, 4 pgs.

Final Office Action for U.S. Appl. No. 11/322,795 mailed Jan. 13, 2010, 12 pgs.

Office Action for EP Application No. 05711376.3 mailed Jan. 11, 2010, 5 pgs.

Office Action for German Application No. 112006001735.7 with translation mailed Oct. 20, 2009, 6 pgs.

Office Action from Taiwan Patent Application No. 95135820 mailed Oct. 22, 2009, 5 pgs.

Non-final Office Action for U.S. Appl. No. 11/855,823 mailed Mar. 15, 2010, 31 pages.

2nd OA KR 10-2007-7030988 mailed Mar. 12, 2010, 3 pgs.

Non-Final Office Action for U.S. Appl. No. 11/335,103 mailed Nov. 13, 2009, 17 pgs.

Final Office Action for U.S. Appl. No. 11/154,138 mailed Dec. 8, 2009, 13 pgs.

Non-Final Office Action for U.S. Appl. No. 11/240,487 mailed Dec. 11, 2009, 11 pgs.

Second Office Action for Chinese Application No. 200680021817.0 mailed Dec. 11, 2009, 11 pgs.

Non-Final Office Action for U.S. Appl. No. 11/240,440 mailed May 12, 2010, 8 pgs.

Final Office Action for U.S. Appl. No. 11/335,103 mailed May 26, 2010, 14 pgs.

Non-Final Office Action for U.S. Appl. No. 12/369,642 mailed Apr. 27, 2010, 15 pgs.

Third Office Action for Chinese Application No. 200580032314.9 mailed Jan. 29, 2010, 21 pgs.

Office Action for European Application No. 03817697.0 mailed Mar. 9, 2010, 8 pgs.

Office Action from Japanese Application No. 2006-549560 mailed Apr. 13, 2010, 8 pgs.

Non-Final Office Action for U.S. Appl. No. 10/973,228 mailed Feb. 2, 2010, 22 pgs.

Chau, Robert, Final Office Action mailed Feb. 17, 2010, 18 pgs.

Wang, X., et al., "Band alignments in sidewall strained Si/strained SiGe heterostructures", (May 28, 2002), 1-5.

Non-Final Office Action for U.S. Appl. No. 11/855,823, mailed Jul. 23, 2009, 31 pages.

Non-Final Office Action from U.S. Appl. No. 11/322,795 mailed Jul. 28, 2009, 18 pgs.

* cited by examiner

FIELD EFFECT TRANSISTOR WITH METAL SOURCE/DRAIN REGIONS

CROSS-REFERENCE TO RELATED APPLICATIONS

This application is a divisional of U.S. patent application Ser. No. 11/080,765, filed Mar. 14, 2005, now abandoned (U.S. Patent Application Publication No. US 2006-0202266), published Sep. 14, 2006, the entire contents of which are hereby incorporated by reference herein.

BACKGROUND OF THE INVENTION

1. Field of the Invention

The present invention relates to the field of semiconductor devices and more particularly to a semiconductor device having a source/drain region comprising a semiconductor portion and a metal portion.

2. Discussion of Related Art

In order to increase the performance of modern integrated circuits, such as microprocessors, silicon on insulator (SOI) transistors have been proposed. Silicon on insulator (SOI) transistors have an advantage in that they can be operated in a fully depleted manner. Fully depleted transistors have an advantage of an ideal subthreshold gradient for optimized on-current/off-current ratios. An example of an proposed SOI transistor which can be operated in a fully depleted manner is a tri-gate transistor 100, such as illustrated in FIG. 1. Tri-gate transistor 100 includes a silicon body 104 formed on insulating substrate 102 having a buried oxide layer 103 formed on a monocrystalline silicon substrate 105. A gate dielectric layer 106 is formed on the top and sidewalls of silicon body 104 as shown in FIG. 1. A gate electrode 108 is formed on the gate dielectric layer and surrounds the body 104 on three sides essentially providing a transistor 100 having three gate electrodes (G1, G2, G3) one on each side of silicon body 104 and one on the top surface of the silicon body 104. A source region 110 and a drain region 112 are formed in the silicon body 104 on opposite sides of the gate electrode 108 as shown in FIG. 1. An advantage of the tri-gate transistor 100 is that it exhibits good short channel effects (SCE). One reason tri-gate transistor 100 has good short channel effects is that the nonplanarity of the device places the gate electrode 108 in such a way as to surround the active channel region. Unfortunately, as tri-gate devices become increasingly smaller, the external contact resistance (Rext) is increasingly becoming more significant portion of the overall device resistance. This is particularly problematic in three dimensional transistors (formed both by etching of Si wafer, or by chemical synthesis of nanowires), where the source region 110 and drain region 112 are formed in the narrow silicon body 104. Unfortunately, standard techniques for reducing contact resistance, such as by forming "raised" source/drain regions where additional epitaxial silicon is formed on the silicon body 104 is difficult to implement in nonplanar transistors. For example, it is difficult to grow "raised" epitaxial source/drain regions on the sides of the silicon body 104. For these reasons the devices suffer from high Rext and degraded performance.

DETAILED DESCRIPTION OF THE PRESENT INVENTION

The present invention is a field effect transistor with metal source/drain regions and its method of fabrication. In the following description, numerous specific details are set forth in order to provide a thorough understanding of the present invention. In other instances, well known semiconductor processes and manufacturing techniques have not been described in particular detail in order to not unnecessarily obscure the present invention.

In embodiments of the present invention, include a metal oxide semiconductor field effect transistor having a pair of source/drain regions which each comprise a semiconductor portion and a metal portion. In an embodiment of the present invention, a replacement source/drain technique is used to etch away a portion of the doped source/drain regions so that they can be replaced with a high conductivity metal, such as platinum and palladium. In this way, a lower R-external may be achieved since the metallic interconnect extends much closer towards the channel region. In an embodiment of the present invention, the metal portion of the source/drain region is made extremely close to the channel region such that the metal is formed adjacent to and in contact with the tip or source/drain extension portion of the source and drain regions. By forming the source region and drain region with a metal portion and a semiconductor portion allows for the scalable switching of the PNP or NPN junctions while bringing the high conductivity metal source/drain electrodes as close to the channel region as possible. In this way, the metal source and drain regions can extend all the way to the tips of the transistor enhancing the external conductivity while circumventing known disadvantages of metal source/drains in direct contact with the channel material (e.g., ambipolar conduction). Although the source/drain structure of the present invention is ideally suited for use in very small width and narrow transistors, such as nonplanar devices, the present invention can be utilized in any transistor where its small size or dimensions causes the transistor to have a high R-external.

Figure 1:
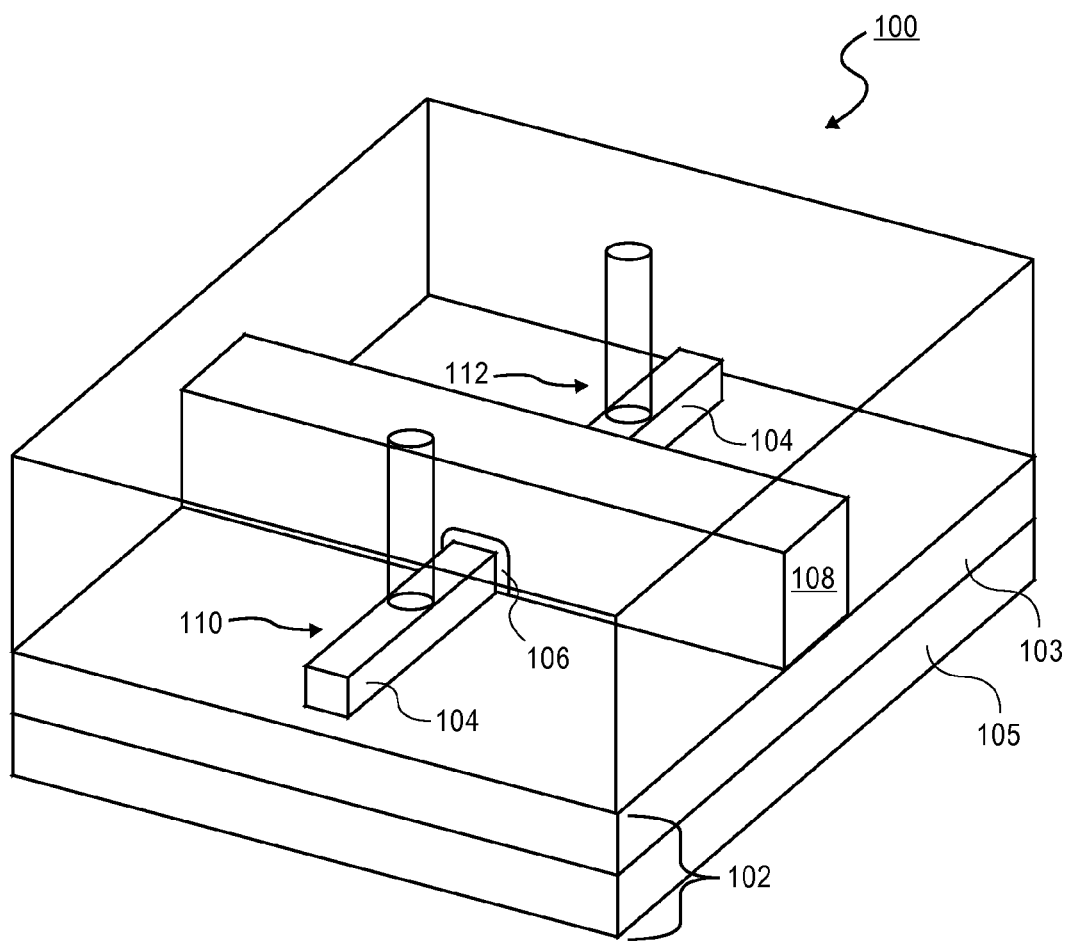
FIG. 1 is an illustration of a cross-sectional view of a nonplanar transistor.
Figure 2A:
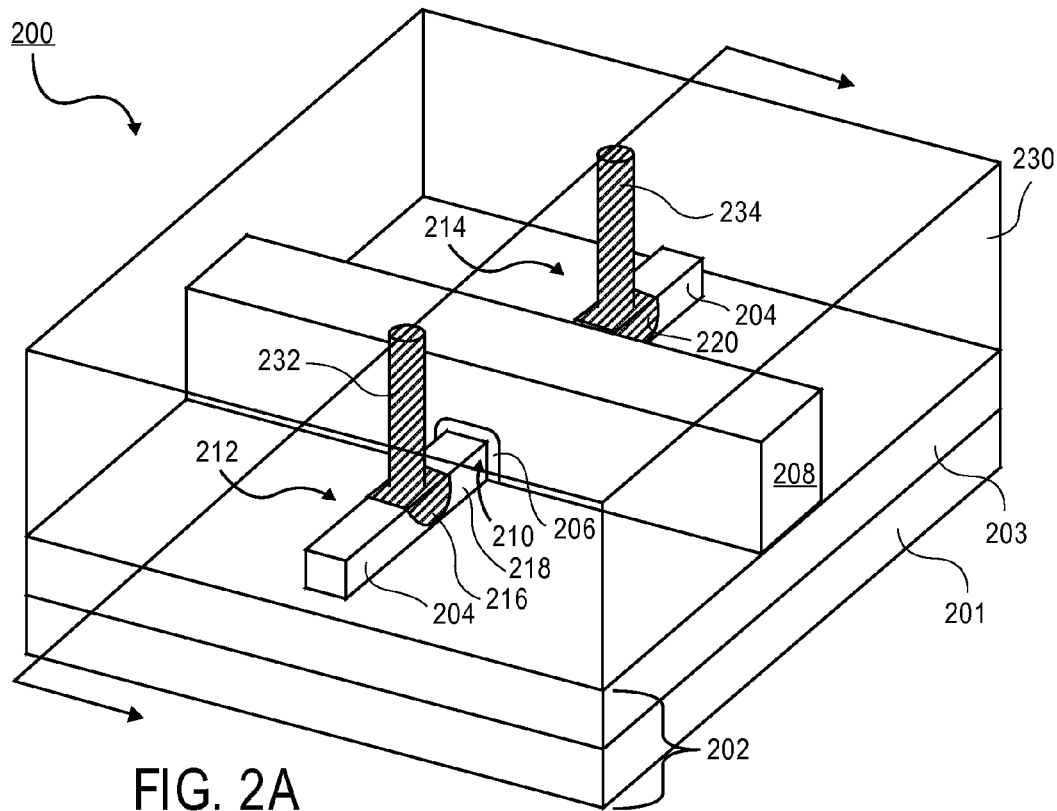
FIG. 2A is an illustration of an overhead/side view of a nonplanar transistor having a metal source and drain region in accordance with the present invention.
Figure 2B:
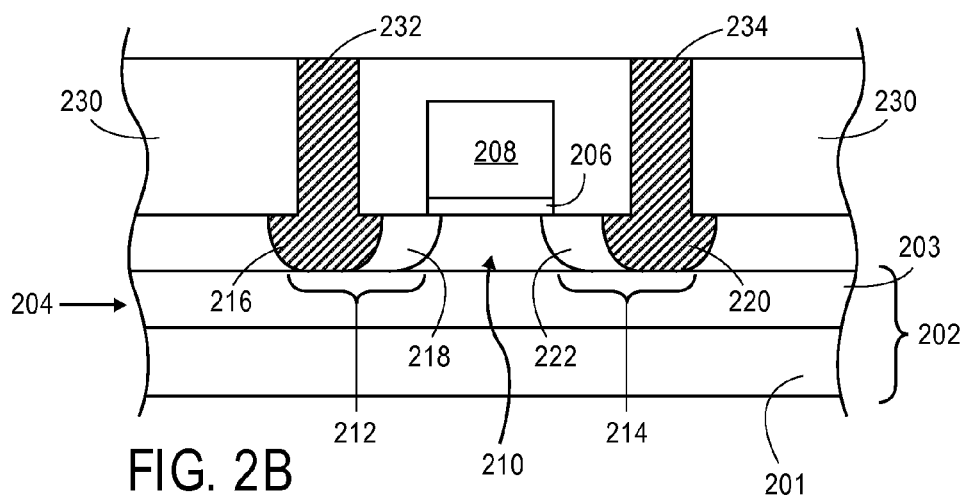
FIG. 2B is a cross-sectional view of a transistor illustrated in FIG. 2A taken through the semiconductor body.

An example of a transistor 200 having source/drain regions with metal portions in accordance with an embodiment of the present invention is illustrated in FIGS. 2A and 2B. FIG. 2A is an illustration of an overhead/side view of transistor 200 while FIG. 2B is an illustration of a cross-sectional view of transistor 200 taken through the semiconductor body. Transistor 200 includes a semiconductor body 204, such as an epitaxial silicon body, formed on an insulating substrate 202. The semiconductor body has top surface opposite a bottom surface formed on an insulating substrate and a pair of laterally opposite sidewalls. In an embodiment of the present invention, the semiconductor body has a height which is approximately equal to its width. A gate dielectric layer 206 is formed on the top surface and sidewalls of the semiconductor body 204 as shown in FIG. 2A. A gate electrode 208 is formed on and around the gate dielectric layer 206 formed on the top surface and sidewalls of the semiconductor body 204. The gate electrode 208 surrounds the channel region 210 of the semiconductor body 204 illustrated in FIG. 2A.

A source region 212 and a drain region 214 are formed in the semiconductor body 204 on opposite sides of the gate electrode 208 as shown in FIGS. 2A and 2B. The source region 212 includes a metal portion 216 and a doped semiconductor portion 218 and drain region 214 includes a metal portion 220 and a doped semiconductor portion 222. The portion of the semiconductor body 204 located between the source region 212 and drain region 214 defines a channel region 210 of transistor 200. The doped semiconductor portions 218 and 222 contact the channel region 210 of the semiconductor device. In an embodiment of the present invention, the metal portions 216 and 220 of the source and drain regions 212 and 214, respectively, extend as close as possible to the channel region 210 without actually contacting the channel region. In an embodiment of the present invention, the metal portion 216 and 220 are offset from the channel region 210 by doped semiconductor portions 218 and 222 by approximately 5 nanometers. In an embodiment of the present invention, the doped semiconductor regions have a doping concentration of between 1e20 and 1e21/cm$^3$. In an embodiment of the present invention, the doped semiconductor portions 218 and 222 are doped to the opposite conductivity type than the dopant conductivity of the channel region 210 of the semiconductor body 204. In an embodiment of the present invention, metal regions 216 and 220 and the doped semiconductor regions 218 and 222 of the source and drain regions 212 and 214 extend completely through the semiconductor body 204 and contact the insulating substrate 202. In an embodiment of the present invention, the metal portions 216 and 220 are formed from a high conductivity metal. In an embodiment of the present invention, the metal portion 216 for the source region 212 and the metal portion 220 of the drain region 214 are formed from a material which forms favorable "Schottky barrier" properties with doped semiconductor portions 218 and 222 of the source and drain regions. In an embodiment of the present invention, when semiconductor portions 218 and 222 are silicon the metal portion may be platinum. In an embodiment of the present invention, when semiconductor 218 and 222 are carbon nanotubes the metal portions may be palladium. In an embodiment of the present invention, when forming a PFET (a p type field effect transistor) where the doped portions of source and drain regions are doped to a p type conductivity and the majority carriers are holes, the metal portions 216 and 220 of the source region 212 and drain region 214 can be a metal, such as but not limited to palladium and platinum. In an embodiment of the present invention, when forming NFET (an n type field effect transistor) where the doped source and drain regions are doped to an n type conductivity and the majority carriers are electrons, the metal portions of the source and drain region can be fabricated from a metal, such as but not limited to aluminum and titanium. It is to be appreciated that the source region 212 and drain region 214 can be collectively referred to as a pair of source/drain regions.

As shown in FIGS. 2A and 2B, an interlayer dielectric layer 230, such as but not limited to a silicon dioxide layer or a low-K dielectric, such as a fluorine doped silicon dioxide, a carbon doped oxide layer or a zeolite dielectric layer is formed over and around transistor 200. The interlayer dielectric layer 230 isolates transistor 200 from the upper levels of metallization used to interconnect the various transistors 200 formed on substrate 202 into functional integrated circuits, such as microprocessors, digital signal processors and memory devices. Metal plugs 232 and 234 are formed through the interlayer dielectric layer 230 and contact the metal portions 216 and 220 of the source and drain regions so electrical contact can be made thereto.

Figure 3A:
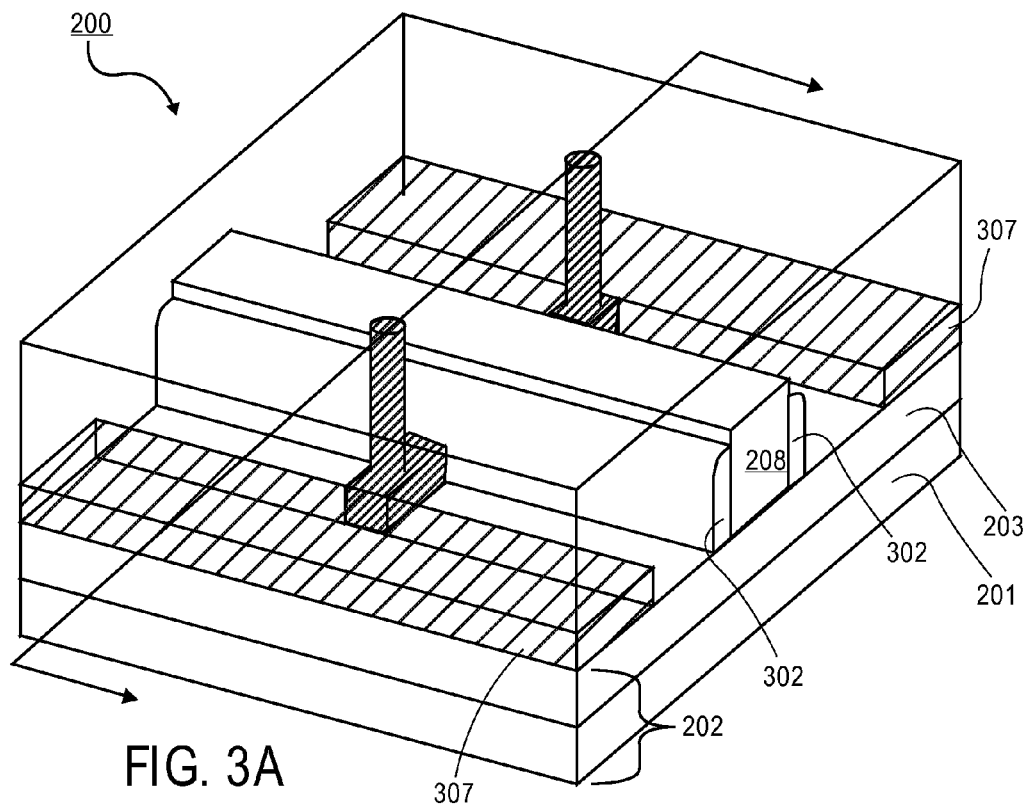
FIG. 3A is an illustration of an overhead/side view of a nonplanar transistor having a metal source/drain region in accordance with an embodiment of the present invention.
Figure 3B:
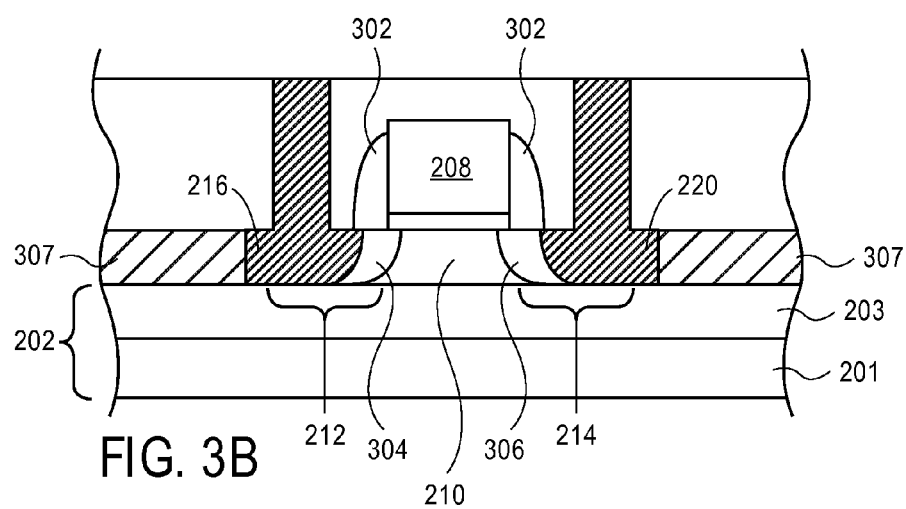
FIG. 3B is a cross-sectional view a transistor illustrated in FIG. 3A taken through the semiconductor body.

In an embodiment of the present invention, as illustrated in FIGS. 3A and 3B, transistor 200 can further include a pair of sidewall spacers 302 which are formed along and adjacent to the laterally opposite sidewalls of gate electrode 208. Sidewall spacers 302 can be formed from any suitable insulating layer, such as but not limited to silicon dioxide, silicon nitride or composite stack thereof. In an embodiment of the present invention, spacers 302 have a width of between 5-20 nanometers. In an embodiment of the present invention, transistor 200 includes a source extension or tip 304 and a drain extension or tip region 306. The source extension region 304 and drain extension region 306 are formed in the semiconductor body and are doped to n type conductivity for an NFET and doped to a p type conductivity for a PFET. The source and drain extensions are located beneath the sidewall spacers and extend slightly beneath the sidewalls of the gate electrode 208. In an embodiment of the present invention, the source extension and drain extension have a doping concentration level of between 5e19-5e20/cm$^3$. In an embodiment of the present invention, the metal portion 216 of the source region 212 and the metal portion 220 of the drain region 214 extend slightly beneath the sidewall spacers and are in contact with the source and drain extension regions 304 and 306, respectively, as shown in FIG. 3B.

In an embodiment of the present invention, isolation regions 307 are formed on insulating substrate 202 in order to isolate transistor 200 from adjacent transistors formed on substrate 202. Isolation regions 307 can be formed from an insulating oxide film, such as silicon dioxide. In an embodiment of the present invention, the metal portion 216 of the source region 212 and the metal portion 220 of the drain region 214 are formed in contact with isolation region 306 as well as in contact with the source and drain extension regions 304 and 306, respectively.

Figure 3C:
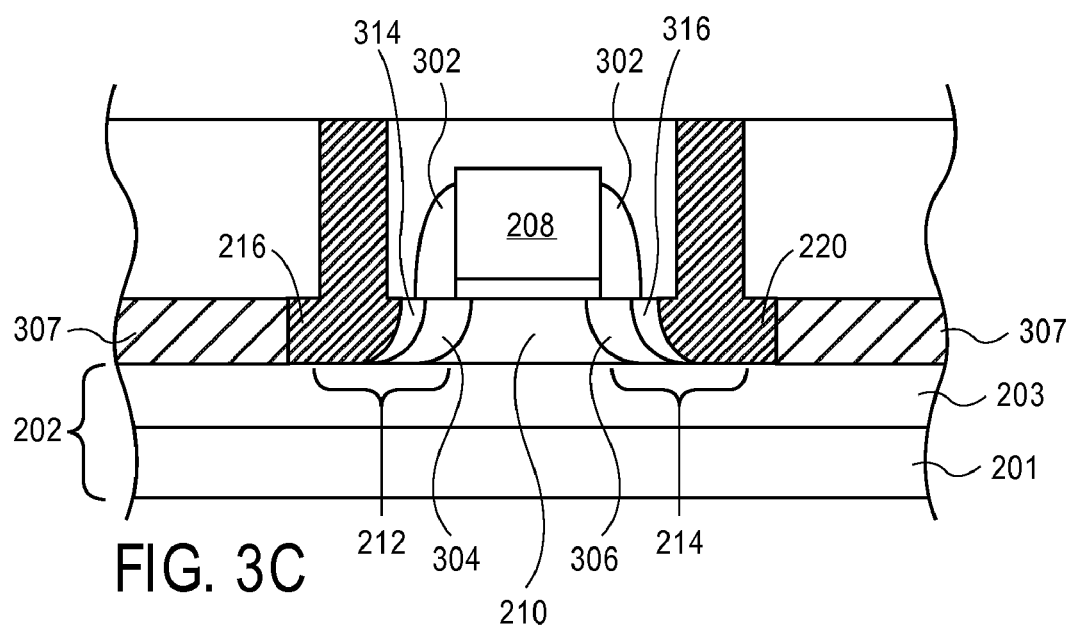
FIG. 3C is a cross-section view of a transistor having a source and drain extension each comprising a metal portion, a doped semiconductor contact portion and an extension portion.

In an embodiment of the present invention, the source region 212 further includes a source contact region 314 and a drain contact region 316 formed in semiconductor body 204. The source and drain contact regions 314 and 316 are heavily doped regions. Heavily doped contact region 314 and 316 are doped to the same conductivity type as the source and drain extensions 304 and 306, but are typically doped to a higher concentration level. In an embodiment of the present invention, the source and drain contact region have a doping concentration between 1e20-1e21/cm$^3$. The heavily doped source and drain contact region 314 and 316 are formed between the source/drain extension regions 304 and 306, and the metal portions 216 and 220 as illustrated in FIG. 3C. As such, in an embodiment of the present invention, the metal portion 216 of the source region 212 is formed in direct contact with the heavily doped source contact region 314 and the metal portion 220 of the drain region 214 is in direct contact with the heavily doped drain contact region 316 as illustrated in FIG. 3C.

Gate electrode 208 can be formed of any suitable gate electrode material. In an embodiment of the present invention, gate electrode 208 comprises a polycrystalline silicon doped to a concentration density between $1 \times 10^{19}$ to $1 \times 10^{20}$ atom/cm$^3$. In an embodiment of the present invention, the gate electrode can be a metal gate electrode, such as but not limited to tungsten, tantalum, titanium and their nitrides. In an embodiment of the present invention, the gate electrode is formed from a material having a midgap work function between 4.6 to 4.8 eV. It is to be appreciated, that gate electrode 208 need not necessarily be a single material and can be a composite stack of thin films, such as but not limited to a polycrystalline silicon/metal electrode or a metal/polycrystalline silicon electrode.

Semiconductor body 204 can be formed of any well known semiconductor material, such as but not limited to silicon (Si), germanium (Ge), silicon germanium ($Si_xGe_y$), gallium arsenide (GaAs), InSb, GaP, GaSb, and carbon nanotubes. Semiconductor body 204 can be formed of any well known material which can be reversely altered from an insulating state to a conductive state by applying external electrical controls. Semiconductor body 204 is ideally a single crystalline film when the best electrical performance of transistor 200 is desired. For example, semiconductor body 204 is a single crystalline film when transistor 200 is used in high performance applications, such as a high density circuit, such as microprocessors. Semiconductor body 204, however, can be a polycrystalline film when transistor 200 is used in applications requiring less stringent performance, such as in liquid crystal displays.

In an embodiment of the present invention, substrate 202 is an insulating substrate which includes a lower monocrystalline silicon substrate 201 upon which is formed in insulating layer 203, such as silicon dioxide film. Transistor 200, however, can be formed on any well known insulating substrate, such as a substrate formed from silicon dioxide, nitrides, oxides and sapphires. In an embodiment of the present invention, substrate 202 can be a semiconductor substrate, such as but not limited to a monocrystalline silicon substrate and a gallium arsenide substrate.

In an embodiment of the present invention, the channel region 210 is intrinsic or undoped monocrystalline silicon. In an embodiment of the present invention, the channel region 210 is doped monocrystalline silicon. When channel region 210 is doped, it is typically doped to a conductivity level between $1\times10^{16}$ to $1\times10^{19}$ atom/cm$^3$. When channel region 210 is doped, it is typically doped to the opposite conductivity type of the doped semiconductor portion of the source region 212 and the doped semiconductor portion drain region 214.

Gate dielectric layer 206 is formed on and around the sides of semiconductor body 204 as shown in FIG. 2A. Gate dielectric layer 206 can be any well known gate dielectric layer. In an embodiment of the present invention, the gate dielectric layer is a silicon dioxide ($SiO_2$), silicon oxynitride ($SiO_xN_y$), or a silicon nitride ($Si_3N_4$) dielectric layer. In an embodiment of the present invention, the gate dielectric layer 206 is a silicon oxynitride film formed to a thickness between 5-20 Å. In an embodiment of the present invention, gate dielectric 206 is a high k gate dielectric layer, such as a metal oxide dielectric, such as but not limited to tantalum pentaoxide, titanium oxide, hafnium oxide, zirconium oxide, aluminum oxide and various silicates or other high k dielectrics, such as lead zirconate titanate (BZT) and barium strontium titanate (BST). (For the purpose of the present invention, a high k dielectric layer is any dielectric film having a dielectric constant k greater than silicon dioxide (k=4.0) and ideally greater than 10).

Figure 4A:
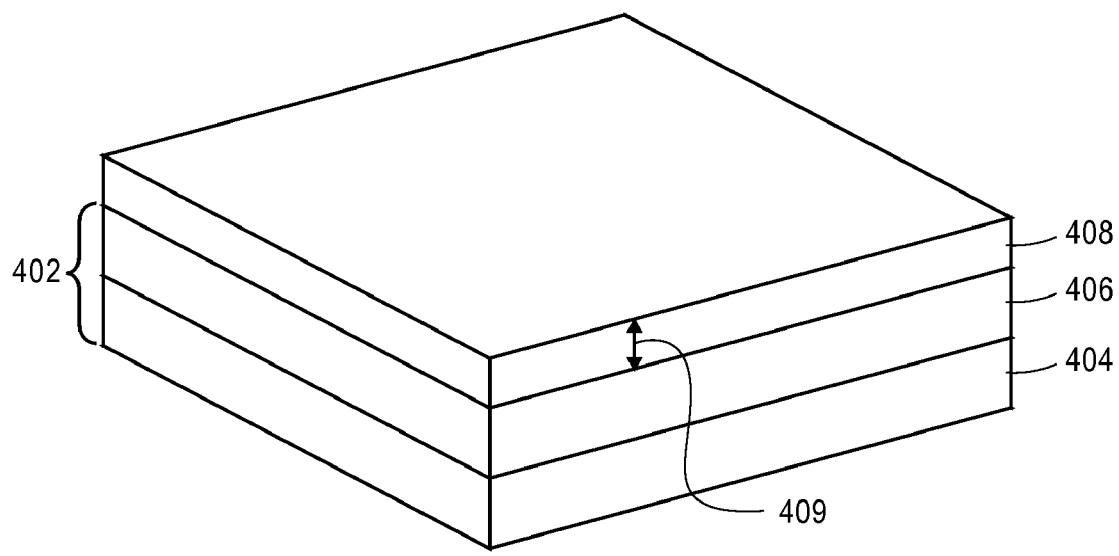
FIGS. 4A-4L illustrate a method of forming a nonplanar transistor having metal portions of a source and drain regions in accordance with embodiment of the present invention.

A method of fabricating a field effect transistor with source and drain regions having metal portions in accordance with embodiments of the present invention is illustrated in FIGS. 4A-4L. The fabrication of the field effect transistor begins with a substrate 402. A silicon or semiconductor film 408 is formed on substrate 402 as shown in FIG. 4A. In an embodiment of the present invention, the substrate 402 is an insulating substrate such as shown in FIG. 4A. In an embodiment of the present invention, insulating substrate 402 includes a lower monocrystalline silicon substrate 404 and a top insulating layer 406, such as a silicon dioxide film or silicon nitride film. Insulating layer 406 isolates semiconductor film 408 from substrate 404 and in an embodiment is formed to a thickness between 200-2000 Å. Insulating layer 406 is sometimes referred to as "a buried oxide" layer. When a silicon or semiconductor film 408 is formed on an insulating substrate 402, a silicon or semiconductor-on-insulator (SOI) substrate is created. In other embodiments of the present invention, substrate 402 can be a semiconductor substrate, such as but not limited to a silicon monocrystalline substrate and a gallium arsenide substrate. Although semiconductor film 408 is ideally a silicon film, in other embodiments it can be other types of semiconductor films, such as but not limited to germanium, silicon germanium, gallium arsenide, InSb, GaP, GaSb as well as carbon nanotubes.

In an embodiment of the present invention, semiconductor film 408 is an intrinsic (i.e., undoped) silicon film. In other embodiments, semiconductor film 408 is doped to a p type or n type conductivity with a concentration level between $1\times10^{16}$ to $1\times10^{19}$ atoms/cm$^3$. Semiconductor film 408 can be insitu doped (i.e., doped while it is deposited) or doped after it is formed on substrate 402 by, for example, ion implantation. Doping after formation enables both PFET and NFET devices to be fabricated easily on the same insulating substrate. The doping level of the semiconductor film 408 determines the doping level of the channel region of the device. In an embodiment of the present invention, semiconductor film 408 is formed to a thickness which is approximately equal to the height desired for the subsequently formed semiconductor body or bodies of the fabricated transistor. In embodiments of the present invention, semiconductor film 408 has a thickness or height 409 of less than 30 nanometers and ideally less than 20 nanometers. In an embodiment of the present invention, semiconductor film 408 is formed to a thickness approximately equal to the gate "length" desired of the fabricated transistor. In an embodiment of the present invention, semiconductor film 408 is formed thicker than the desired gate length of the device. In an embodiment of the present invention, a semiconductor film 408 is formed to a thickness which will enable the fabricated transistor to be operated in a fully depleted manner for a desired gate length (Lg).

Semiconductor film 408 can be formed on insulating substrate 402 in any well known method. In one method of forming a silicon-on-insulator substrate, known as the "SIMOX" technique, oxygen atoms are implanted at a high dose into a single crystalline silicon substrate and then annealed to form the buried oxide 406 within the substrate. The portion of the single crystalline silicon substrate above the buried oxide becomes a silicon film. In another method an epitaxial silicon film transfer technique which is generally referred to as bonded SOI may be utilized to form a SOI substrate.

Figure 4B:
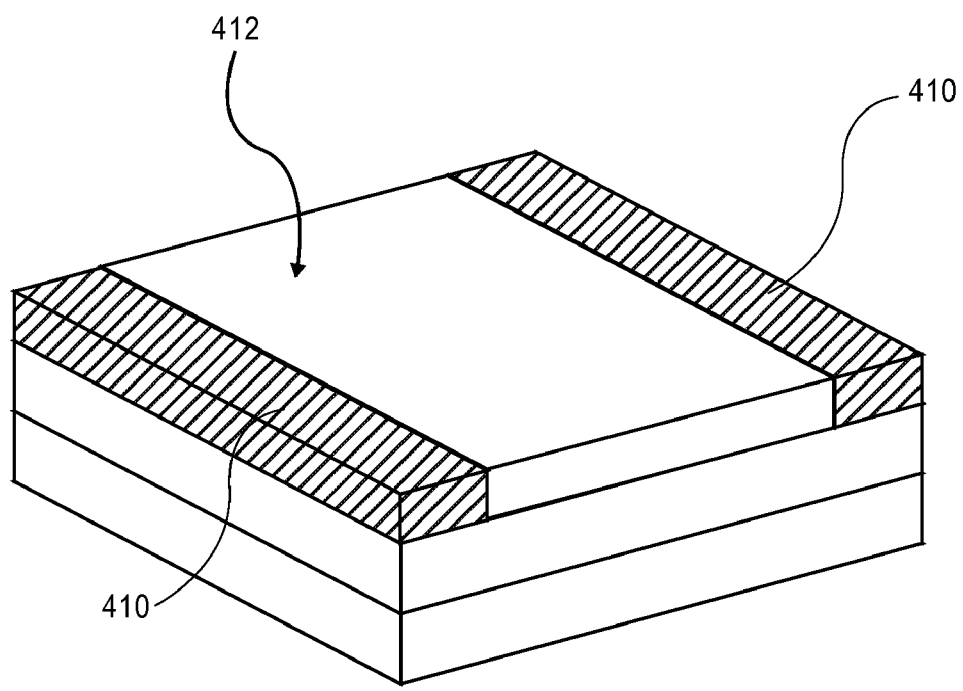

In an embodiment of the present invention, as shown in FIG. 4B, isolation regions 410 can be formed in the semiconductor film 408 to isolate the various transistors formed in semiconductor film 408 from one another. Isolation regions 410 can be formed by etching away portions of the semiconductor film 408 adjacent to the transistor fabrication area 412 in semiconductor film 408. Well know photolithography and etching techniques can be used to remove the semiconductor film at locations where isolation regions 410 are desired. An insulating film, such as but not limited to silicon dioxide, can then be blanket deposited into the areas where the semiconductor film 408 has been etched out as well as on over the semiconductor film 408 in the device fabrication area 412.

The deposited insulating film can then be polished back by, for example, chemical mechanical polishing (CMP) to remove the insulating film from the device fabrication area 412 and thereby form isolation regions 410 which are planar with the top surface of the semiconductor film 408 in the device fabrication area 412. Other well known and suitable techniques may be utilized to form isolation regions 410.

Figure 4C:
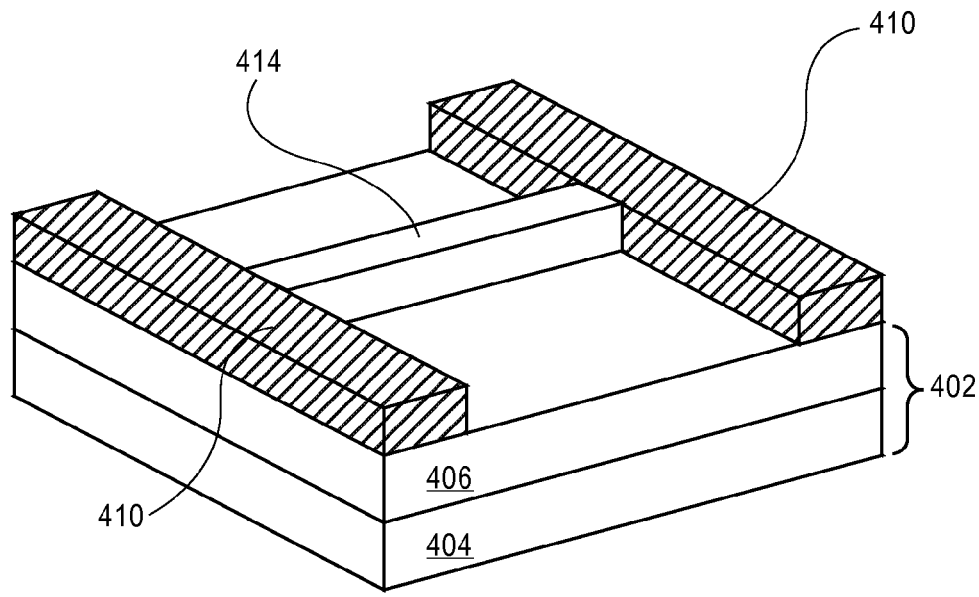

Next, a semiconductor body 414 is formed from semiconductor film 408 as shown in FIG. 4C. Semiconductor body 414 can be formed by forming a photoresist mask over the locations of semiconductor film 408 where a semiconductor body 414 is desired. A photoresist mask can be formed with well known photolithography techniques including masking, exposing and developing a blanket deposited photoresist film. Semiconductor film 408 would then be etched in alignment with the photoresist mask to form semiconductor body 414. Any well known semiconductor etching techniques, such as anisotropic plasma etching or reactive ion etching, can be used to etch semiconductor film 408 in alignment with the photoresist mask to form semiconductor body 414. In an embodiment of the present invention, the semiconductor body is etched so that it has a width (i.e. distance between laterally opposite sidewalls) which is approximately equal to its height.

Figure 4D:
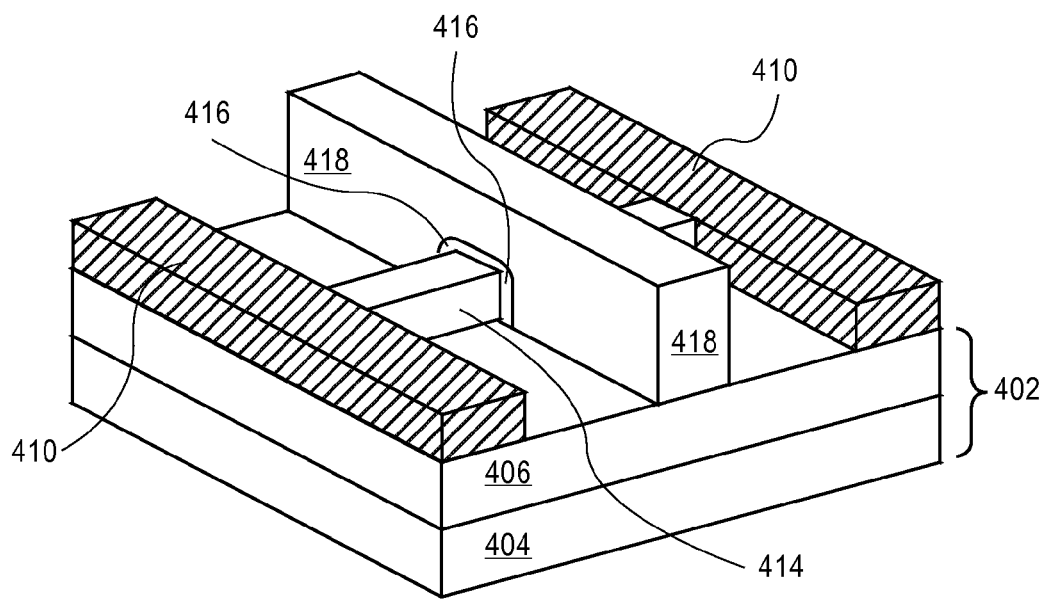

Next, as shown in FIG. 4D, a gate dielectric layer 416 is formed on and around semiconductor body 414. The gate dielectric layer 416 is formed on a top surface of the semiconductor body as well as on the laterally opposite sidewalls of the semiconductor body 414. The gate dielectric layer 416 can be a deposited dielectric or a grown dielectric. In an embodiment of the present invention, the gate dielectric layer 416 is a silicon dioxide dielectric film grown with a dry/wet oxidation process. In an embodiment of the present invention, the silicon oxide film is grown to a thickness between 5-15 Å. In an embodiment of the present invention, the gate dielectric layer is deposited dielectric, such as but not limited to a high dielectric constant film, such as a metal oxide dielectric, such as tantalum pentaoxide, titanium oxide, hafnium oxide, zirconium oxide, aluminum oxide and various silicates or other high k dielectrics, such as lead zirconate titanate (BZT) and barium strontium titanate (BST). A high dielectric constant film can be formed by any well known technique, such as but not limited to chemical vapor deposition (CVD) and atomic layer deposition (ALD).

Next, as also shown in FIG. 4D, a gate electrode 418 is formed. Gate electrode 418 is formed on gate dielectric layer 416 formed on the top surface of semiconductor body 414 and is formed on or adjacent to the gate dielectric layer 416 formed on or adjacent to the sidewall of the semiconductor body 414 as shown in FIG. 4D. The gate electrode 418 has a top surface opposite a bottom surface formed on insulating substrate 402 and has a pair of laterally opposite sidewalls which run perpendicular to the sidewalls of semiconductor body 414. Gate electrode 418 can be formed by blanket depositing a suitable gate electrode material to a thickness between 200-3000 Å. The gate electrode material is then patterned with well known photolithography and etching techniques to form a gate electrode 418 from the gate electrode material. In an embodiment of the present invention, the gate electrode material comprises a polycrystalline silicon. In an embodiment of the present invention, the gate electrode material comprises a polycrystalline silicon germanium alloy. In yet another embodiment of the present invention, the gate electrode material can comprise a metal film, such as tungsten, tantalum and their nitrides. Alternatively, to a substractive approach for forming the gate electrode 418, other techniques may be utilized.

Figure 4E:
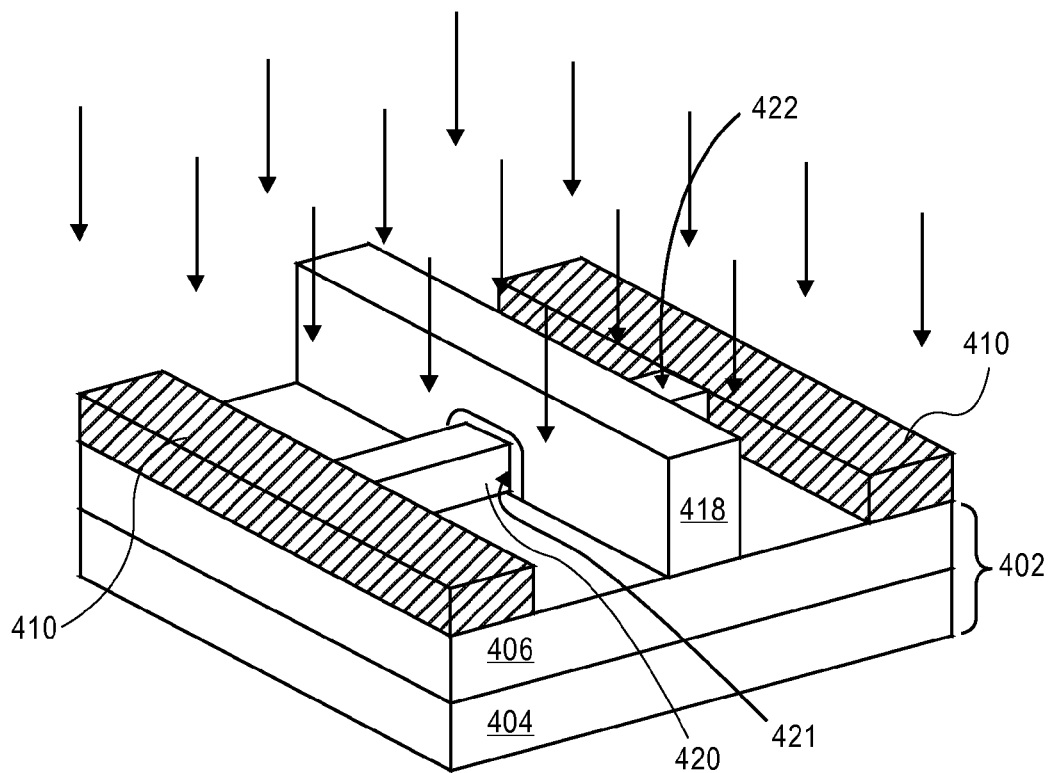

Next, a pair of source/drain regions are formed in the semiconductor body 414 on opposite sides of gate electrode 418. As stated above, the source and drain regions each comprise a doped semiconductor portion and a metal portion. First, the semiconductor portions of the source/drain regions can be formed. In an embodiment of the present invention, the doped semiconductor portions include tip or source/drain extension regions. Source and drain extension regions 420 and 422 can be formed by placing dopants into the semiconductor body 414 on both sides of gate electrode 418 as shown in FIG. 4E. For a p type transistor, the semiconductor body is doped to a p type conductivity and to a concentration of between $1 \times 10^{20}$-$1 \times 10^{21}$ atoms/cm$^3$. For an n type transistor, the semiconductor body is doped with n type conductivity ions to a concentration between $1 \times 10^{20}$-$1 \times 10^{21}$ atoms/cm$^3$. In an embodiment of the present invention, the silicon body is doped by ion implantation. In an embodiment of the present invention, the ion implantation occurs in a vertical direction (i.e., a direction perpendicular to substrate 402) as shown in FIG. 4E. When gate electrode 418 is a polysilicon gate electrode, it can be doped during the ion implantation process. Gate electrode 418 acts as a mask to prevent the ion implantation step from doping the channel region 421 of the transistor. The channel region 421 is the portion of the semiconductor body 414 located beneath or surrounded by gate electrode 418. In other embodiments or other methods, such as solid source diffusion may be used to dope the semiconductor body 414 to the source and drain extension regions 420 and 422.

Figure 4F:
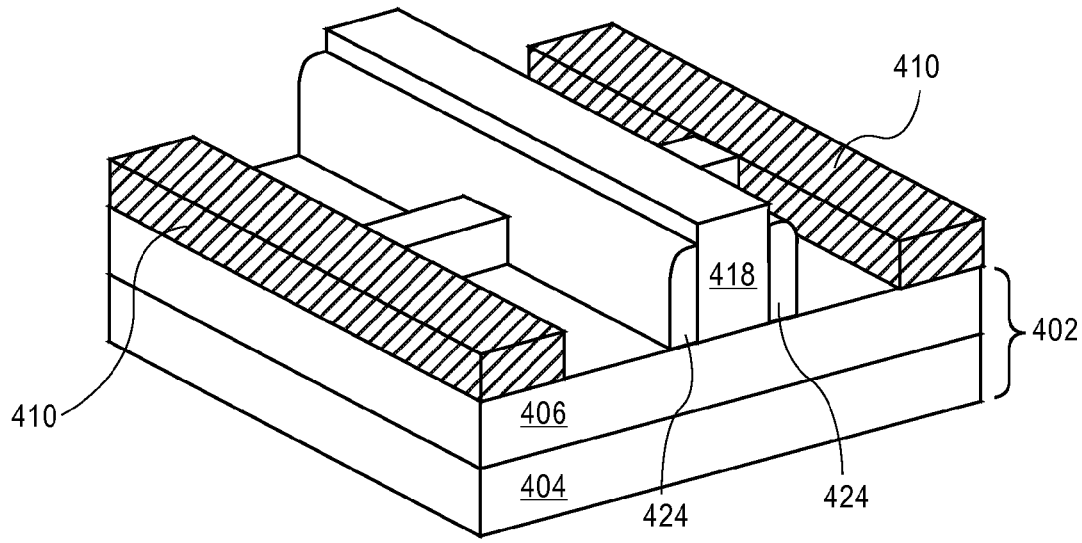
Figure 4G:
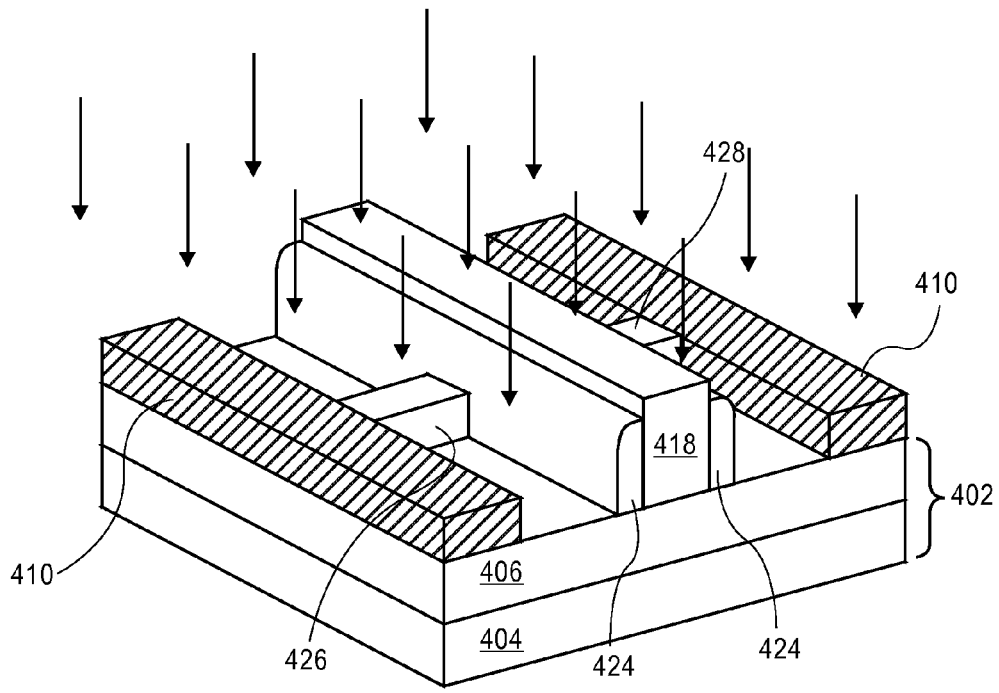

Next, in an embodiment of the present invention, dielectric sidewall spacers 424 can be formed on the sidewalls of gate electrode 418. Sidewall spacers can be used to offset heavy source/drain contact implants. Spacers can be formed by blanket depositing a conformal dielectric film, such as but not limited to silicon nitride, silicon oxide, silicon oxynitride or combinations thereof over the substrate of FIG. 4E. The spacer dielectric film is deposited in a conformal manner so that it forms to substantially equal thickness on vertical surfaces, such as sidewalls of the gate electrode 418 as well as on horizontal surfaces, such as on the top surface of silicon body 414 and gate electrode 418. In an embodiment of the present invention, the dielectric film is a silicon nitride film formed by a hot wall lower pressure chemical vapor deposition (LPCVD) process. The deposited thickness of the dielectric film determines the width or thickness of the formed spacers. In an embodiment of the present invention, the spacer dielectric film is formed to a thickness between 20-200 Å. The spacer dielectric film can then be anisotropically etched by, for example, plasma etching or reactive ion etching to form sidewall spacers 424. The anisotropic etch removes the dielectric film from horizontal surfaces and leaves the dielectric sidewall spacers adjacent to vertical surfaces, such as the sidewalls of gate electrode 418. The result is the formation of sidewall spacers 424 which run along the laterally opposite sidewalls of gate electrode 418 as shown in FIG. 4F.

Next, if desired, heavy source/drain contact implants can be made to form heavily doped semiconductor film 414. Heavily doped source/drain contact regions can be formed by ion implantation with a vertical ion implantation process. The ion implantation process dopes the semiconductor body 414 located adjacent to the sidewall spacers to a concentration between $1 \times 10^{20}$-$1 \times 10^{21}$ atoms/cm$^3$ to form source contact region 426 and drain contact region 428. Sidewall spacers 424 offset the source/drain contact implantation step and define the tip regions as the regions of the doped semiconductor body 414 beneath sidewall spacers 424. The contact regions are the regions of the semiconductor body which are adjacent to the outside edges of the sidewall spacers 424.

Figure 4H:
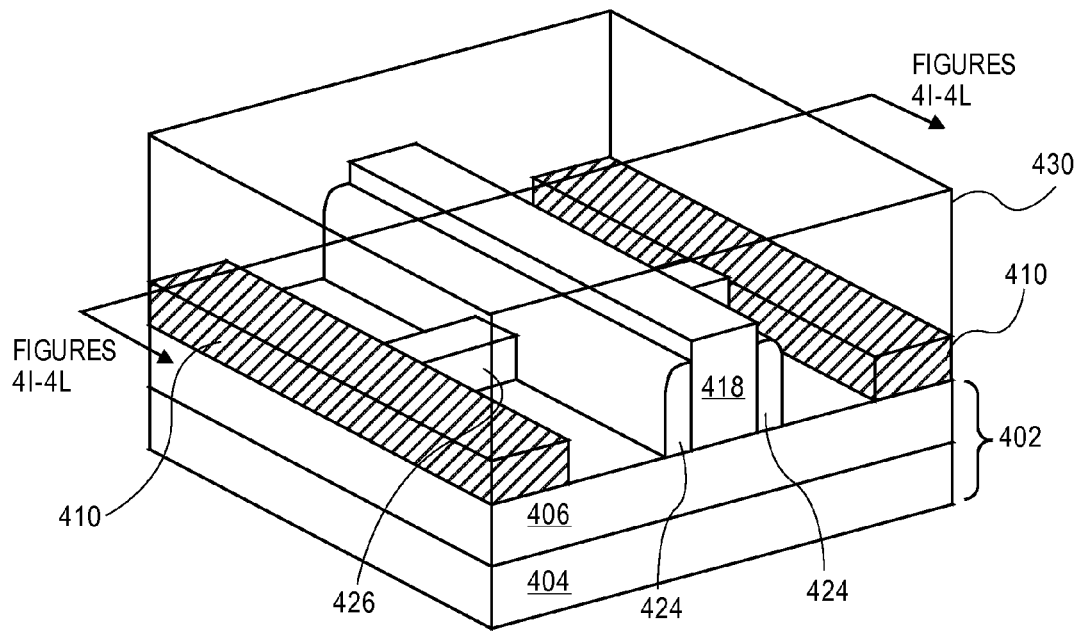

Next, an interlayer dielectric (ILD) 430 is blanket deposited over the substrate as shown in FIG. 4H. The interlayer dielectric may be referred to as ILD0 because it is used to isolate the transistor from a subsequently formed first level of metallization. The interlayer dielectric (ILD) 430 is formed above isolation regions 410 and over and above gate electrode 418 as well as above and around the exposed portion of semiconductor body 414. The interlayer dielectric 430 fills the gap made between semiconductor body 414, isolation region 410 and the gate electrode/sidewall spacers 424/418. Interlayer dielectric 430 is formed to a thickness sufficient to isolate gate electrode 418 and semiconductor body 414 from a first level of metallization subsequently formed on the top surface of the interlayer dielectric 430. In an embodiment of the present invention, the interlayer dielectric 430 is formed to a thickness between 100 and 500 nm. Interlayer dielectric 430 can be formed from any suitable dielectric material, such as silicon dioxide, which can be used as an interlayer dielectric. Additionally, interlayer dielectric 430 need not be a single dielectric film and can be a composite dielectric formed from two or more dielectric layers. Additionally, prior to the formation of interlayer dielectric 430, a stress providing layer, such as silicon nitride, can be formed over and around the transistor in order to place the channel region 421 of the device under stress to improve the carrier mobility therein. In an embodiment of the present invention, the interlayer dielectric 430 can be a low k dielectric (i.e., have a dielectric constant less than the dielectric constant of silicon dioxide which is approximately 4.0) in order to prevent capacitance coupling between adjacent contacts. In an embodiment of the present invention, an interlayer dielectric is formed from a low k material, such as but not limited to fluorine doped $SiO_2$, a carbon doped oxide (CDO), polymides, and zeolites.

In an embodiment of the present invention, ILD 430 is formed of a material which can be selectively etched with respect to semiconductor body 414 so that an opening can be etched into the semiconductor body without laterally etching into ILD 430 adjacent to the sidewalls of the semiconductor body 414. In an embodiment of the present invention, interlayer dielectric 430 is formed from the same material, such as silicon dioxide, which is used to form isolation regions 410. In an embodiment of the present invention, after depositing interlayer dielectric 430, the dielectric layer can be planarized by, for example, chemical mechanical planarization in order to form the interlayer dielectric 430 with a planar top surface. Any suitable technique can be used to deposit the interlayer dielectric 430, such as but not limited to chemical vapor deposition (CVD) and high density plasma (HDP) CVD.

Next, as illustrated in 4I-4L, contact openings are etched through interlayer dielectric 430 and into semiconductor body 414 and then filled with a metal to form the metal portions of the source and drain regions. It is to be appreciated that FIGS. 4I-4L illustrate a cross-sectional view taken through the semiconductor body 414 as set forth in FIG. 4H.

Figure 4I:
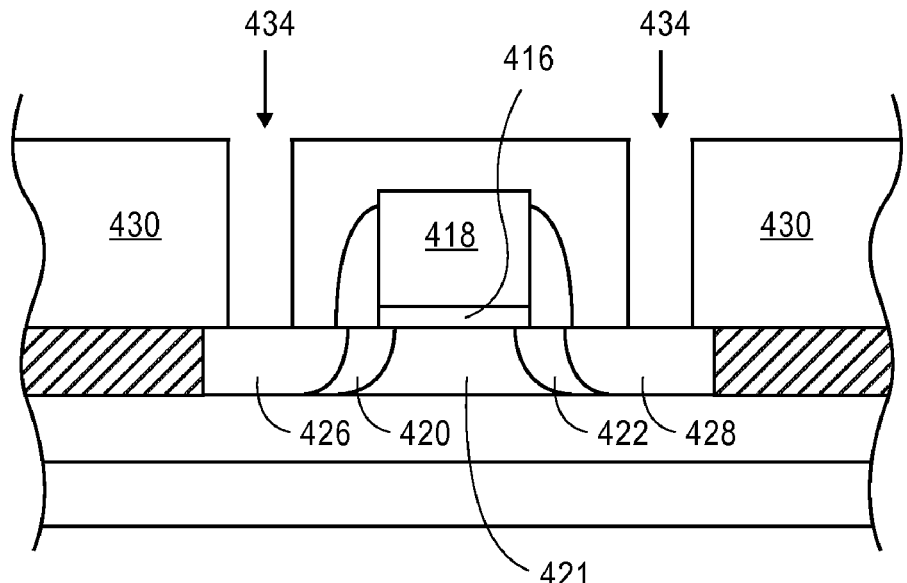

First, as illustrated in FIG. 4I, a pair of contact opening 434 and 436 is formed through interlayer dielectric and down to the source contact region 426 and the drain contact 428 of semiconductor body 414. Well known photolithography techniques can be used to form a photoresist mask to define the locations where openings 434 and 436 are to be formed and then well know etching techniques can be used to etch the openings 434 and 436. Any well known and suitable etching technique including dry etching and wet etching may be used to form openings 434 and 436. In an embodiment of the present invention, when ILD 430 is a silicon dioxide film and semiconductor body 414 is silicon, an etchant comprising HF may be used. In an embodiment of the present invention, the etchant used to form contact openings 434 and 436 is selective semiconductor 414 so that it can etch through the interlayer dielectric 430 and essentially stop etching on the semiconductor body 414. In an embodiment of the present invention, an etchant which has an etch selectivity ratio between silicon dioxide and silicon of at least 10:1 is used.

Figure 4J:
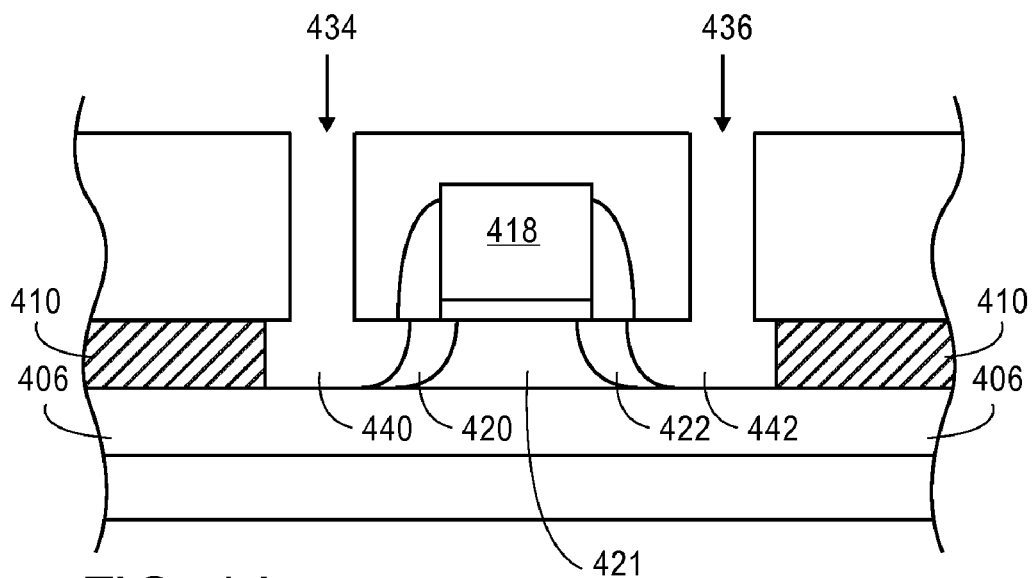

Next, as illustrated in FIG. 4J, openings 440 and 442 are etched into semiconductor body 414. In an embodiment of the present invention, the semiconductor body etchant etches laterally towards the channel of the device. In an embodiment of the present invention, the etching of the openings 440 and 442 is continued until the tip or extension portions 420 and 422 of the source and drain regions are reached as illustrated in FIG. 4J. In an alternative embodiment of the present invention, the etching may not quite reach the tip portions 420 and 422 of the source and drain regions and may leave a portion of the heavily doped source/drain contact regions 426 and 428 as discussed earlier. Additionally, in an embodiment of the present invention, the openings 440 and 442 are etched vertically downward until they reach buried oxide layer 406 as illustrated in FIG. 4J. Additionally, in an embodiment of the present invention, the openings are etched laterally or horizontally outward until isolation regions 410 are reached as illustrated in FIG. 4J. In an embodiment of the present invention, the openings 440 and 442 are etched with an etchant which has a high selectivity to interlayer dielectric 430, isolations regions 410 and buried oxide layer 406. That is an etchant is used which etches semiconductor body 414 but not interlayer dielectric 430, isolation regions 410 or buried oxide layer 406. In this way, the openings 440 and 442 are securely contained between buried oxide layer 406, the isolation region 410 and the interlayer dielectric 430 as illustrated in FIG. 4J. Any suitable wet or dry etching techniques may be utilized to form openings 440 and 442. The etching process should be substantially isotropic in order to provide for lateral undercutting of openings 434 and 436 as illustrated in FIG. 4J. In an embodiment of the present invention, when interlayer dielectric 430 and insulating layer 410 are oxide films and the semiconductor body is a silicon, then the silicon body can be etched to form openings 440 and 442 with an etchant comprising KOH.

Figure 4K:
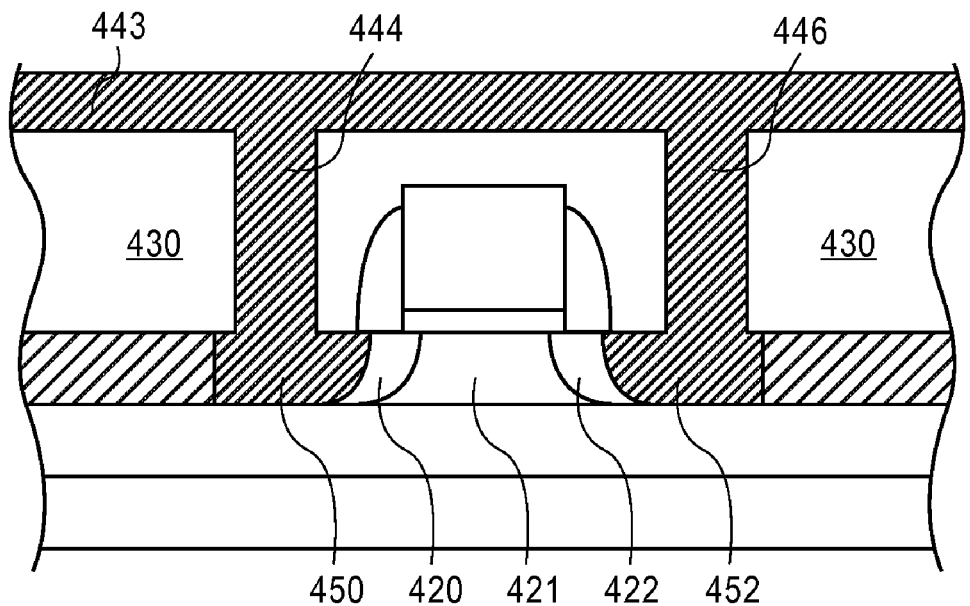

Next, as illustrated in FIG. 4J, openings 440 and 442 formed in semiconductor body 414 and contact openings 434 and 436 are filled with a metal film 443 to form source and drain contacts 444 and 446 and the metal portions 450 and 452 of the source and drain regions. The source and drain metal portions 450 and 452 make direct contact with highly doped semiconductor portion of the source and drain regions. In an embodiment of the present invention, the doped semiconductor portion is the tip or source/drain extension regions 420 and 422. In an alternative embodiment of the present invention, the metal portions 450 and 452 make direct contact with the heavily doped source and drain contact regions 426 and 428. Additionally, in an embodiment of the present invention, metal portions 450 and 452 are formed directly onto the buried oxide layer 406 and in an embodiment of the present invention, in contact the outside portions of isolation regions 410 as illustrated in FIG. 4K. In an embodiment of the present invention, the metal 443 is formed by a conformal deposition process so that the contact openings 440 and 442 formed in the semiconductor body 414 can be completely filled with the metal film. A blanket deposition of a conformal metal film by, for example, chemical vapor deposition (CVD) or atomic layer deposition (ALD) will also deposit the film onto the top surface of the interlayer dielectric layer 430 as illustrated in FIG. 4K. In an embodiment of the present invention, the metal film 443 is a low resistance, high conductivity metal film. In an embodiment of the present invention, the metal film 443 is a film which can form a Schottky contact with the doped semiconductor portion of the semiconductor body. In an embodiment of the present invention, when forming an NFET type device, the metal film can be a metal selected from the group consisting of aluminum and titanium. In an embodiment of the present invention, when forming PFET type device, the metal film can be a metal selected from the group consisting of palladium and platinum. In an embodiment of the present invention, when semiconductor body is formed from silicon the metal film can be platinum. In an embodiment of the present invention, when the semiconductor body is formed from carbon nanotubes, the metal film can comprise palladium and aluminum.

Figure 4L:
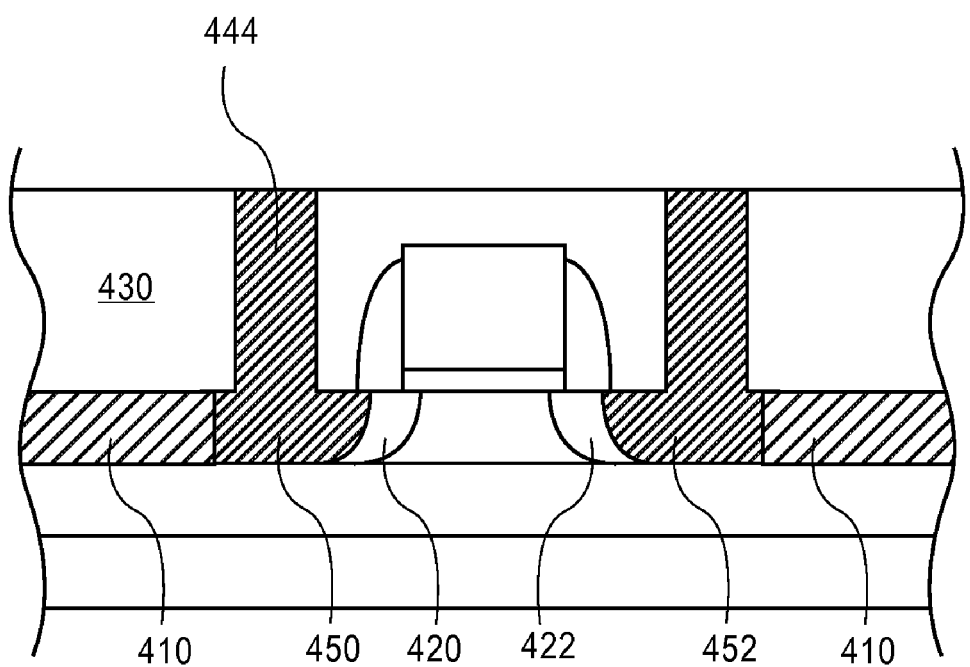

Next, as shown in FIG. 4L, the metal film 443 formed on the top surface of the interlayer dielectric 430 is removed by well known techniques. Metal film 443 on the top surface of the interlayer dielectric area 430 can be removed by, for example, chemical mechanical planarization or by a plasma etch back process. This completes the fabrication of a field effect transistor having source and drain regions with metal portions to improve external resistance (Rext) of the device.

It is to be appreciated that although the present invention has been described with respect to a nonplanar transistor, such as a tri-gate transistor, the present invention is not to be limited to these types if transistors. For example, the present invention is equally applicable to the formation of source and drain regions of a planar transistor where the gate electrode and gate dielectric layer are formed on a single surface of semiconductor film as is well know in the art. Additionally, the present invention is equally applicable to FINFET devices or dual gate devices where the gate electrode/gate dielectric is formed on two sides of the semiconductor body and not on the top surface of the semiconductor body as is well known in the art.

We claim:

1. A method of forming a transistor comprising:
    forming a gate electrode having a pair of laterally opposite sidewalls on a gate dielectric layer formed on a semiconductor layer;
    forming a pair of source/drain extensions in said semiconductor layer on opposite sides of said gate electrode;
    forming a pair of sidewall spacers adjacent to sidewalls of said gate electrode and on said source/drain extensions;
    forming a pair of source/drain contact regions in said semiconductor layer on opposite sides of said sidewall spacers;
    forming an interlayer dielectric adjacent to said sidewall spacers and over said source/drain contact regions;
    etching a pair of contact openings through said interlayer dielectric to expose a portion of said source/drain contact regions;
    etching away a portion of said source/drain contact regions to form a pair of etched-out source/drain contact regions, each etched-out source/drain contact region having an opening into said semiconductor layer, wherein each opening into said semiconductor layer is larger than each of the pair of contact openings formed through said interlayer dielectric; and
    depositing a metal film into said contact openings and into said etched-out source/drain contact regions.

2. The method of claim 1 wherein said metal film in said etched-out source/drain contact regions directly contacts said source/drain extensions.

3. The method of claim 1 wherein said metal film is formed beneath said sidewall spacers.

4. The method of claim 1 wherein said source/drain extensions are formed by ion implanting dopants in alignment with said sidewalls of said gate electrode.

5. The method of claim 1 wherein said source/drain contact regions are formed by ion implanting dopants into said semiconductor film in alignment with the outside edges of said sidewall spacers.

6. A method of forming a nonplanar transistor comprising:
    forming a semiconductor body having a top surface opposite a bottom surface formed on an insulating layer of an insulating substrate, said semiconductor body having a pair of laterally opposite sidewalls;
    forming a gate dielectric layer on the top surface and sidewalls of said semiconductor body;
    forming a gate electrode having a pair of laterally opposite sidewalls on said gate dielectric layer and on the top surface of said semiconductor body and adjacent to said gate dielectric layer on said sidewalls of said semiconductor body;
    forming a pair of source/drain extensions in said semiconductor body on opposite sides of said gate electrode;
    forming a pair of sidewalls spacers adjacent to said gate electrode and on and adjacent to said source/drain extensions formed in said semiconductor body;
    forming a pair of source/drain contact regions in said semiconductor body on opposite sides of said sidewall spacers;
    forming an interlayer dielectric layer over and adjacent to said semiconductor body and adjacent to said sidewall spacers;
    etching a pair of contact openings through said interlayer dielectric layer to said source/drain contact regions in said semiconductor body;
    etching away a portion of said source/drain contact regions in said semiconductor body, wherein said etching of said portion of said source/drain contact regions in said semiconductor body etches until said insulating layer of said insulating substrate is reached; and
    depositing a metal film in said contact openings and in said etched away portion of said semiconductor body.

7. The method of claim 6 wherein said metal film in said etched away portion of said semiconductor body contacts said source/drain extension regions.

8. A method of forming a nonplanar transistor comprising:
    forming a semiconductor body having a top surface opposite a bottom surface formed on an insulating layer of an insulating substrate, said semiconductor body having a pair of laterally opposite sidewalls;
    forming a gate dielectric layer on the top surface and sidewalls of said semiconductor body;
    forming a gate electrode having a pair of laterally opposite sidewalls on said gate dielectric layer and on the top surface of said semiconductor body and adjacent to said gate dielectric layer on said sidewalls of said semiconductor body;
    forming a pair of source/drain extensions in said semiconductor body on opposite sides of said gate electrode;
    forming a pair of sidewalls spacers adjacent to said gate electrode and on and adjacent to said source/drain extensions formed in said semiconductor body;
    forming a pair of source/drain contact regions in said semiconductor body on opposite sides of said sidewall spacers;
    forming an interlayer dielectric layer over and adjacent to said semiconductor body and adjacent to said sidewall spacers;

etching a pair of contact openings through said interlayer dielectric layer to said source/drain contact regions in said semiconductor body;

etching away a portion of each of said source/drain contact regions in said semiconductor body to provide a pair of openings into said semiconductor body, wherein each opening of said pair of openings into said semiconductor body is larger than each of the contact openings formed through said interlayer dielectric; and depositing a metal film in said contact openings and in said etched away portion of said semiconductor body.

* * * * *